United States Patent [19]

Ootaka et al.

[11] Patent Number: 5,636,004
[45] Date of Patent: Jun. 3, 1997

[54] PROJECTION EXPOSURE METHOD AND APPARATUS

[75] Inventors: Akihiro Ootaka; Yoshio Kawai; Tadahito Matsuda, all of Kanagawa, Japan

[73] Assignee: Nippon Telegraph and Telephone Corporation, Japan

[21] Appl. No.: 515,583

[22] Filed: Aug. 16, 1995

[30] Foreign Application Priority Data

Aug. 19, 1994 [JP] Japan ................................. 6-195395
Feb. 17, 1995 [JP] Japan ................................. 7-029190

[51] Int. Cl.$^6$ ............................ G03B 27/32; H01L 21/30
[52] U.S. Cl. .............................. 355/67; 355/53; 355/77; 430/311
[58] Field of Search ........................... 355/53, 67, 71, 355/77; 430/396, 311

[56] References Cited

U.S. PATENT DOCUMENTS

| | | |
|---|---|---|
| 4,869,999 | 9/1989 | Fukuda et al. . |
| 4,904,569 | 2/1990 | Fukuda et al. . |
| 4,937,619 | 6/1990 | Fukuda et al. . |
| 4,992,825 | 2/1991 | Fukuda et al. . |
| 5,357,311 | 10/1994 | Shiraishi ................................. 355/53 |
| 5,448,336 | 9/1995 | Shiraishi ................................. 355/71 |

OTHER PUBLICATIONS

"Improving Resolution in Photolithography with a Phase-Shifting Mask", (Levenson et al., IEEE Transactions on electron device vol. ED-29 (1982).

"High resolution optical lithography system using oblique incidence illumination", (Matsuo et al., IEDM (1991) ).

"0.25 µm Periodic Structures For Lightwave Technology Fabricated By Spatial Frequency Doubling Lithography (SFDL)", (J. E. Jewell et al., SPIE Proceeding vol. 1088 Optical/Laser Microlithography II (1989), 496).

"A New Method for Enhancing Focus Latitude in Optical Lithography: FLEX", (H. Fukuda et al., IEEE Electron device letters, vol. EDL-8, No. 4 (1987).

"Subhalf Micron Lithography System with Phase-Shifting Effect" (M. Noguchi et al., SPIE vol. 1674 Optical/Laser Microlithography V (1992) pp. 92–104).

"Improvement of defocus tolerance in a half–micron optical lithography by the focus latitude enhancement exposure method: Simulation and experiment", (H. Fukuda et al., J.Vac.Sci. Technol. B 7(4), Jul/Aug 1989 pp. 667–674).

"A Novel Method for Improving the Defocus Tolerance in Step and Repeat Photolithography" (T. Hayashida et al., SPIE vol. 772 Optical Microlithography VI (1987) pp. 66–71.

Primary Examiner—Arthur T. Grimley
Assistant Examiner—David A. Lane
Attorney, Agent, or Firm—Blakely Sokoloff Taylor & Zafman

[57] ABSTRACT

In a projection exposure method of irradiating illumination light from an illumination light source onto a photomask made of a transparent substrate with a periodic mask pattern, and projecting the resultant transmitted light from the photomask on a wafer through a projection system, thereby forming an optical image of the mask pattern on the wafer, projection/exposure with respect to the wafer is performed by a main exposure operation and a sub-exposure operation to be performed after the main exposure operation. The main exposure operation is performed by irradiating the photomask with the illumination light whose coherency becomes 0.3 or less when a period L of the mask pattern on the image plane of the optical system is not more than a value obtained by doubling an exposure wavelength $\lambda$ of the illumination light source, and dividing the resultant value by a numerical aperture of the projection system. The sub-exposure operation is performed by irradiating the photomask with the illumination light having a coherency of 0.3 or less at at least one of positions separated from a position in the main exposure operation in the optical axis direction by $\Delta=\lambda/[2\{1-(1-\lambda^2/L^2)^{1/2}\}]$, thereby forming a periodic pattern having a period ½ the period L on the wafer.

16 Claims, 18 Drawing Sheets

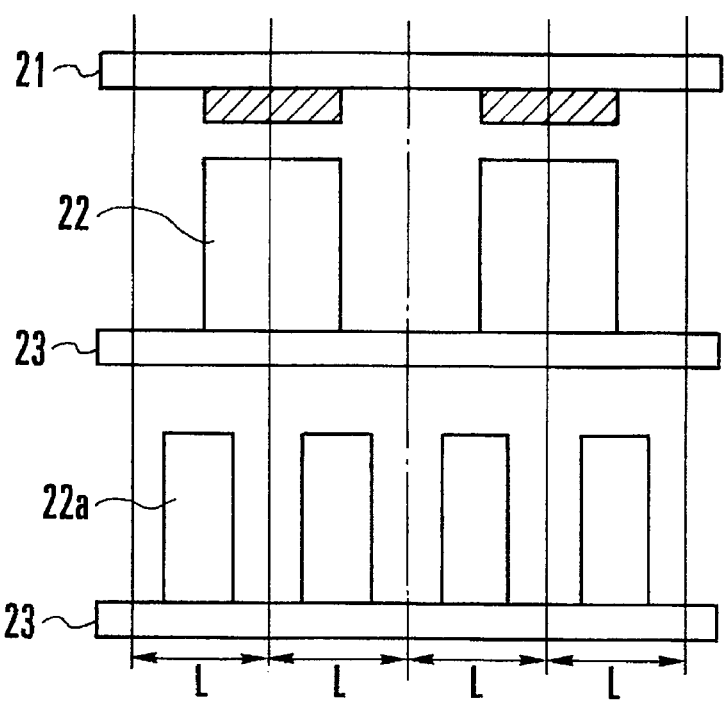
FIG. 2A
FIG. 2B
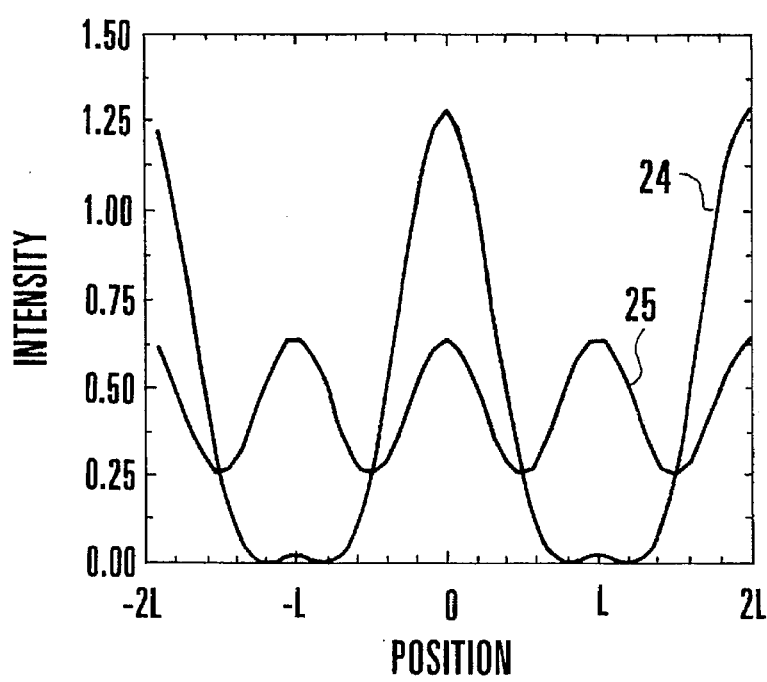
FIG. 2C

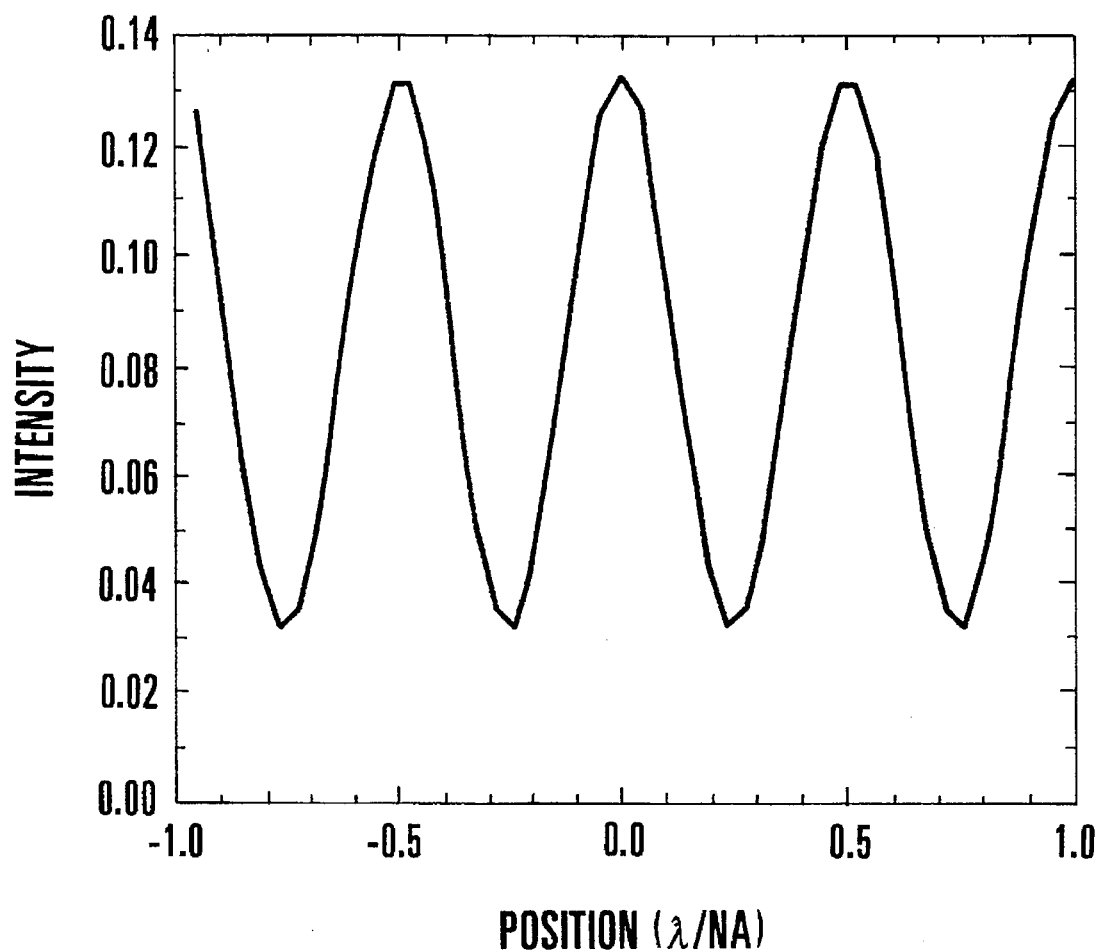
F I G. 6

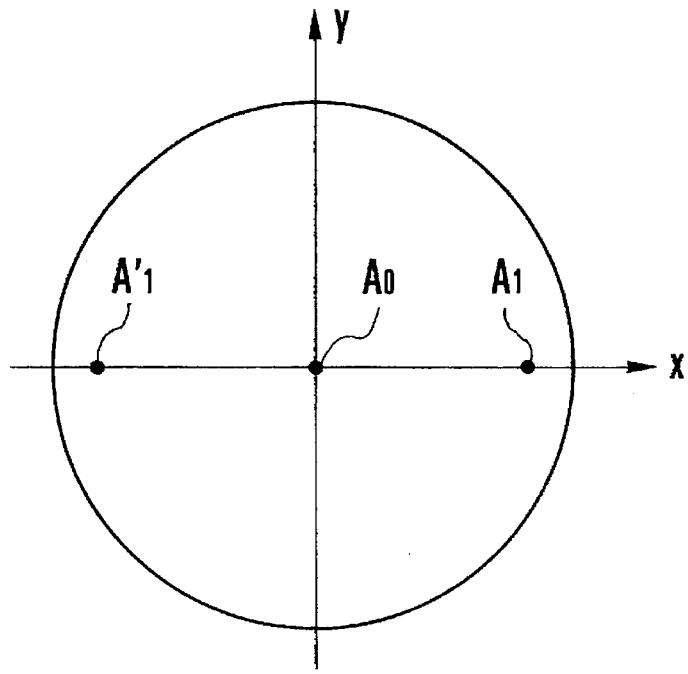
F I G.13A
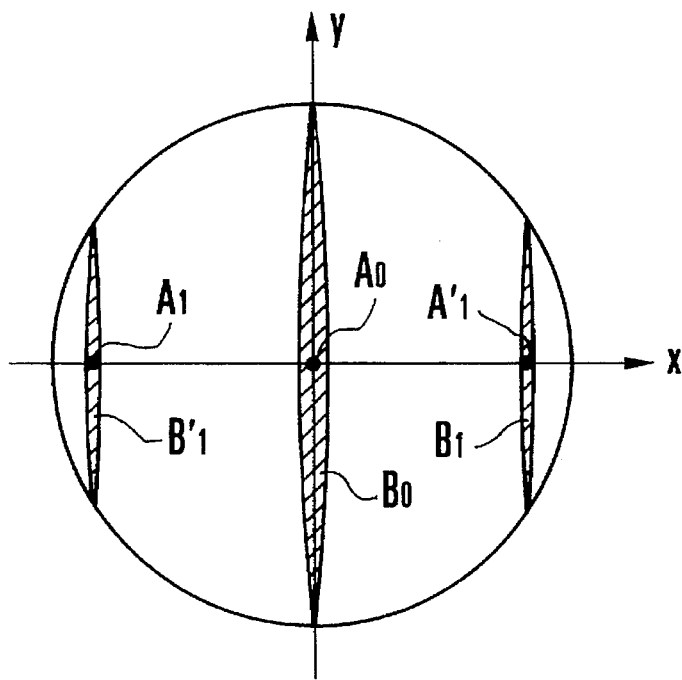
F I G.13B

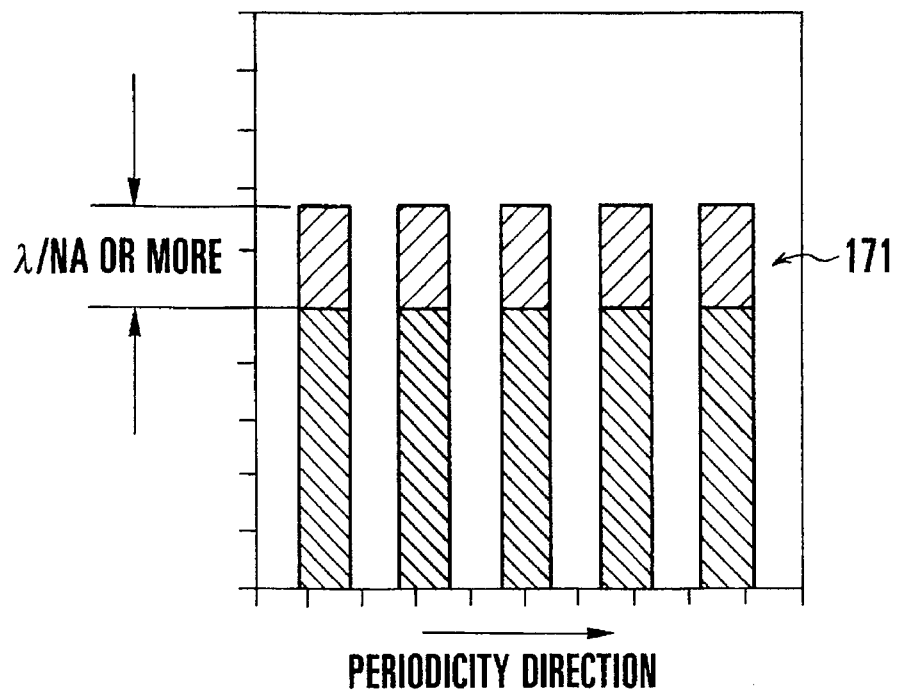
F I G. 17
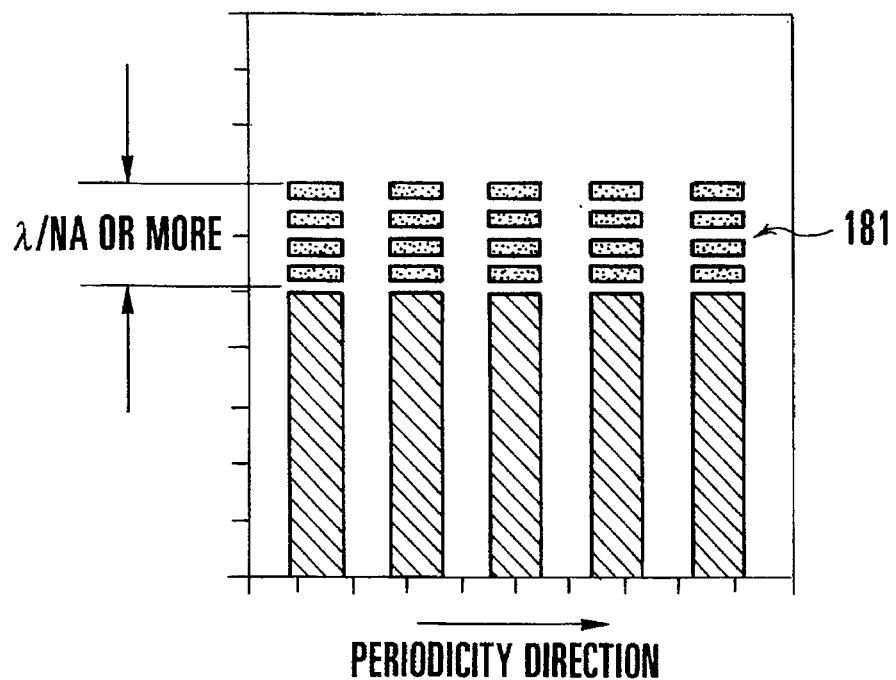
F I G. 18

PROJECTION EXPOSURE METHOD AND APPARATUS

BACKGROUND OF THE INVENTION

The present invention relates to a projection exposure method and apparatus which form a fine pattern such as an LSI pattern on a substrate by using a photomask and a projection lens.

In lithography using a projection exposure apparatus, fine patterns have been formed by decreasing the exposure wavelength and increasing the numerical aperture (NA) of a projection lens.

Although finer patterns can be formed with a decrease in wavelength and an increase in NA, the depth of focus tends to decrease as the patterns decrease in size. For this reason, with a decrease in the size of a pattern, the depth of focus of the optical image cannot meet the practical requirement.

FIG. 23 shows intensity distributions on an image projection plane on which projection images are projected when a projection system having an exposure wavelength $\lambda$ and a numerical aperture NA and using a lines and spaces pattern of $0.4\lambda/NA$ in a normal projection exposure operation. Note that the lines and spaces pattern is a striped periodic pattern. In this case, lines are spaced $0.4\lambda/NA$ apart.

Referring to FIG. 23, a curve 231 represents the intensity distribution (continuous line) on the image projection plane when the focus position coincides with the image projection plane; a curve 232, the intensity distribution (dotted line) on the image projection plane when the focus position is shifted from the image projection plane by $0.52\lambda/NA^2$; a curve 233, the intensity distribution (chain line) on the image projection plane when the focus position is shifted from the image projection plane by $0.50\lambda/NA^2$; and a curve 234, the intensity distribution (chain double-dashed line) on the image projection plane when the focus position is shifted from the image projection plane by $1.00\lambda/NA^2$.

In the intensity distribution 231 in a just focus state, i.e., when the image projection plane coincides with the focus position of the projection system, a lines and spaces pattern is formed. However, in the intensity distributions 232, 233, ... in defocus states, the optical image of the pattern deteriorates. In the intensity distribution 233 with a defocus of $\pm 0.5\lambda/NA^2$, the intensity distribution of the image is flat and line patterns can not be created. For this reason, the optical depth of focus in the above normal projection exposure operation becomes $\pm 0.5\lambda/NA^2$.

For example, when NA=0.5 in a KrF exposure operation, the depth of focus is $\pm 0.5$ µm, which is not a sufficient value in practice. Note that a KrF exposure operation is performed by using a KrF excimer laser having a wavelength of 0.248 µm as a light source.

As described above, in a normal projection exposure operation, finer patterns cannot be formed without sacrificing practical depths of focus. This problem will be described below by exemplifying the lines and spaces pattern formed as a periodic pattern.

In such a normal projection exposure operation, an optical image is formed on an image projection plane when a plurality of diffracted light beams which have been generated on a photomask and passed through a projection lens interfere with each other. In this case, the smaller the pitch of the lines and spaces pattern on the photomask, the larger the angle at which light diffracted by the photomask spreads. If the pitch of the lines and spaces pattern is smaller as compared with the cutoff frequency, the angle defined by two adjacent diffracted light beams is large enough to go beyond the projection lens.

For this reason, with such a small pitch, only one of diffracted light beams generated on the photomask can pass through the projection lens. Since only one diffracted light beam reaches the image projection plane, no interference occurs on the image projection plane. No optical image, therefore, can be formed.

In some method, a projection lens having a large numerical aperture corresponding to the largest incidence angle of the lens is used to spread the range of the angle of the diffracted light beams. In another method, the exposure wavelength is decreased to decrease the angle of diffraction occurring on the photomask.

In either method, however, as a pattern to be formed is reduced to a submicron size (approaching the cutoff frequency of a currently available exposure optical system), the contrast deteriorates, and the depth of focus decreases. That is, both the methods are not practical.

In brief, in a normal projection exposure operation, finer patterns cannot be formed without sacrificing practical depths of focus. A demand, therefore, has arisen for a method which can form finer patterns without sacrificing the depths of focus.

As a method of forming finer patterns without sacrificing depths of focus, a method using a phase-shifting mask has been proposed (Levenson et al., IEEE Transactions on electron device vol. ED-29 (1982)). A method using modified illumination has also been proposed (Matsuo et al., IEDM (1991)).

In these methods, diffracted light generated in a direction parallel to the optical axis through a photomask is eliminated by using the phase of the light, thereby forming a fine periodic pattern with a practical depth of focus of 1 µm or more.

As another method of forming a fine periodic pattern with a practical depth of focus of 1 µm or more by eliminating diffracted light generated in a direction parallel to the optical axis through a photomask, a pupil filter method has been proposed (J. E. Jewell et al., SPIE Proceeding vol. 1088 Optical/Laser Microlithography II (1989), 496).

A multiple exposure method (Fukuda et al., IEEE electron device letter vol. EDL-8 (1987)) has also been proposed as a method of increasing the depth of focus, although this method cannot be used to reduce the size of a pattern.

The method using a phase-shifting mask will be described first.

FIG. 24 shows the arrangement of a phase-shifting mask. Reference numeral 241 denotes a substrate consisting of a transparent material such as quartz glass; 242, light-shielding portions each consisting of a Cr film formed on the surface of the substrate 241; 243, light-transmitting portions between the light-shielding portions 242; and 244, a shifter formed at every other light-transmitting portion 243.

In the method using the phase-shifting mask, as shown in FIG. 24, each shifter 244 is formed to make the respective adjacent light-transmitting portions 243 have a phase difference of 180°, thereby nullifying the intensity at the portions of the image projection plane which correspond to the light-shielding portions 242.

The method using this phase-shifting mask will be described from the viewpoint of diffraction of light.

FIGS. 25A, 25B, and 25C show arrangements for a projection exposure operation. Reference numeral 251 denotes illumination light; 251a, modified illumination light irradiated at a given incident angle; 252, a phase-shifting mask of the Levenson type; 252a, a general transmission mask; 253, 253A, and 253B, projection lenses; 254, an image projection plane; 255a and 255b, 1st- and −1st-order diffracted light beams; 256a and 256b, ±2nd-order light beams; 257a and 257b, ±3rd-order diffracted light beams; and 259, a pupil filter.

Referring to FIG. 25B, reference numeral 255c denotes a 0th-order light beam; 256c, a −1st-order diffracted light beam; and 257c, a −2nd-order diffracted light beam.

As shown in FIG. 25A, no diffracted light is generated by the phase-shifting mask 252 in a direction parallel to the optical axis.

This means that a 0th-order diffracted light beam parallel to the optical axis is eliminated upon interference of light on the mask surface, and only the ±1st-order diffracted light beams 255a and 255b generated in directions symmetrical with respect to the optical axis pass through the projection lens 253 to be used to form an optical image on the image projection plane 254.

With this operation, no diffracted light is generated in the optical axis direction by interference of light on the mask surface, but only diffracted light beams generated in the directions symmetrical with respect to the optical axis interfere with each other on the image projection plane, thereby forming an optical image. Diffracted light in the optical axis direction causes a deterioration in contrast owing to a defocus state.

In this case, the angle defined by the light beams interfering with each other on the image projection plane 254 can be set to the largest incident angle of the projection lens 253.

Under such conditions that cause light beams at the same angle with respect to the optical axis to interfere with each other, the intensity and shape of the optical image undergo no change even if the focus position is changed.

For this reason, the resolution limit can be set to the cutoff frequency of the projection system so that a fine lines and spaces pattern can be formed with a large depth of focus.

In this method, however, shifters for inverting the phase of transmitted light must be arranged on a phase-shifting mask, as shown in FIG. 24. For this reason, the number of steps in manufacturing a mask is larger than that in manufacturing a general transmission mask. In addition, since shifters consisting of a transparent material are arranged on the mask, inspection of defects in the mask and correction thereof are difficult to perform.

In contrast to this, in the method shown in FIG. 25B, which uses the modified illumination light 251a, the modified illumination light 251a is obliquely incident on the transmission mask 252a to make adjacent light-transmitting portions 261a of the conventional transmission mask 252a have a phase difference of 180°, thereby nullifying the intensity of at the portions of the image projection plane which correspond to light-shielding portions 261b, as shown in FIG. 26.

This method is especially effective for a periodic pattern, similar to the phase-shifting mask described above.

A pattern finer than that in the prior art can be formed with a sufficient depth of focus.

In addition, since a transmission mask made of a light-shielding member consisting of, e.g., Cr, which is used for a general exposure operation, is used, there is no difficulty in manufacturing a mask unlike the case wherein a phase-shifting mask is used.

FIG. 25B shows the directions of diffracted light beams in this method. These directions are the same as those in FIG. 25A.

In the method of using the modified illumination, as in the method using the phase-shifting mask, no diffracted light is generated in a direction parallel to the optical axis, and an image is formed by using diffracted light beams at the same angle with respect to the optical axis.

In this method, however, since the incident direction of illumination light has a close relationship with the repeating direction of a periodic pattern, the depths of focus of patterns in all directions cannot be increased.

As indicated by the perspective view of FIG. 27, the depth of focus of a pattern 271 on a mask 270 on the image projection plane can be increased by using illumination light 272 in the direction shown in FIG. 27.

The illumination light 272 is incident on a pattern 273, which is formed at 90° with respect to the pattern 271, from a direction perpendicular to the repeating direction. For this reason, with regard to the pattern 273, no phase difference occurs between the adjacent light-transmitting portions, and hence no increase in depth of focus is attained.

As described above, the method using modified illumination exhibits a dependence on the periodicity direction of a periodic pattern. Annular illumination has been proposed to eliminate such dependence on the periodicity direction of a pattern.

However, this illumination shape is obtained by only averaging the direction dependencies of a pattern. For this reason, an increase in depth of focus in this method is smaller than that in the method using the optimal illumination shape. That is, a sufficient depth of focus cannot be obtained.

In the pupil filter method, as shown in FIG. 25C, the light-shielding filter (pupil filter) 259 is inserted in the pupil plane of the projection lenses 253A and 253B to block light diffracted by the photomask 252 in direction parallel to the optical axis. As a result, only ±1st-order diffracted light beams diffracted in directions symmetrical about the optical axis reach the image plane and interfere with each other. For this reason, a fine periodic pattern can be formed with a practical depth of focus as in the phase-shifting mask or modified illumination method.

In this method, however, since the light-shielding filter 259 is inserted in the pupil plane of the projection lens to block 0th-order diffracted light having a high intensity, which is transmitted through the mask without being scattered, heat generated by the light-shielding filter changes the magnification or aberration of the lens, or a problem is posed in terms of pattern design, that is, all areas on the mask on which no patterns are formed always become light-shielding areas.

A multiple exposure method (FLEX method) is also available, in which exposure is performed a plurality of number of times as the image projection plane position is shifted from the just focus position.

This method is especially effective for isolated patterns.

At an isolated pattern, the intensity decreases because of a defocus state. Consequently, if exposure is performed at a plurality of positions shifted from the just focus position, exposure at defocus positions hardly contributes to pattern formation because the optical image decreases in intensity.

In a multiple exposure operation, a pattern on a portion corresponding to an exposure operation at the focus position nearest to the just focus position is formed.

For this reason, pattern formation can be performed with a small defocus dependence.

In this multiple exposure method, however, the depth of focus is not theoretically increased infinitely, unlike in the above three methods.

In addition, since the intensity at each defocus position is added to the intensity at the just focus position, the contrast of the optical image deteriorates as compared with that of the optical image at the just focus position. For this reason, this multiple exposure method cannot cope with the formation of a fine pattern on the submicron order or less.

Furthermore, in the case of a periodic pattern such as a lines and spaces pattern, the exposure intensity does not decrease unlike in the case of an isolated pattern. For this reason, as shown in FIG. 23, only the contrast of the optical image deteriorates because of a defocus state.

When, therefore, exposure is performed at a plurality of positions shifted from the just focus position, images which are formed at the defocus positions and have poor contrast are superimposed on an image at the just focus position with almost equal intensities. That is, in the multiple exposure method, the above effect of increasing the depth of focus cannot be obtained.

With the above-described arrangement, according to the conventional method using a phase-shifting mask, it is not easy to manufacture a mask, forming shifters and the like.

In the method using modified illumination, a sufficient depth of focus cannot be obtained because of the direction dependence of a pattern and the like.

In the method using a pupil filter, heat is generated in the lens, and patterns to be formed are undesirably limited.

The multiple exposure method is not effective in reducing the size of a pattern, and offers no effect of increasing the depth of focus with respect to a periodic pattern.

SUMMARY OF THE INVENTION

It is, therefore, the principal object of the present invention to provide a projection exposure method and apparatus which can easily expose a fine periodic pattern with a desired depth of focus.

It is another object of the present invention to provide a projection exposure method and apparatus which can form a periodic pattern on a wafer, without any direction dependence, more accurately than the prior art.

In order to achieve the above objects, according to the present invention, there is provided a projection exposure method of irradiating illumination light from an illumination light source onto a photomask made of a transparent substrate having a periodic mask pattern formed thereon, and projecting the resultant transmitted light from the photomask on a wafer through a projection system, thereby forming an optical image of the periodic mask pattern on the wafer, wherein projection and exposure with respect to the wafer are performed by a main exposure operation and a sub-exposure operation to be performed after the main exposure operation, the main exposure operation is performed by irradiating the photomask with the illumination light whose coherency becomes not more than 0.3 when a period L of the periodic mask pattern on an image plane of the projection system is not more than a value obtained by doubling an exposure wavelength $\lambda$ of the illumination light source and dividing the resultant value by a numerical aperture of the projection system, and the sub-exposure operation is performed by irradiating the photomask with the illumination light whose coherency is not more than 0.3 at at least one of a plurality of positions separated from a position in the main exposure operation in an optical axis direction by $\Delta=\lambda/[2\{1-(1-\lambda^2/L^2)^{1/2}\}]$, thereby forming a periodic pattern having a period ½ the period L on the wafer.

In addition, according to the present invention, there is provided a projection exposure apparatus for irradiating illumination light from an illumination light source onto a photomask made of a transparent substrate having a periodic mask pattern formed thereon, and projecting/exposing the resultant transmitted light from the photomask onto a wafer through a projection system, thereby forming an optical image of the periodic mask pattern on the wafer, comprising an illumination light source having a coherency of not more than 0.3, and optical control means for calculating a value $\Delta=\lambda/[2\{1-(1-\lambda^2/L^2)^{1/2}\}]$ from a period L of the periodic mask pattern on the image plane and a wavelength $\lambda$ of the illumination light source, and performing control to set an image projection plane on the wafer and the image plane of the projection system at positions separated from each other by a predetermined distance so as to set a first positional relationship in a main exposure operation, and to make the respective planes have a positional relationship different from the first positional relationship in the main exposure operation by the value $\Delta$ on an optical axis in a sub-exposure operation, wherein exposure is performed while the image projection plane on the wafer and the image plane of the projection system have a plurality of positional relationships with respect to the first positional relationship.

Furthermore, according to the present invention, there is provided a projection exposure method of irradiating illumination light from an illumination light source onto a photomask made of a transparent substrate having a periodic mask pattern formed thereon, and projecting the resultant transmitted light from the photomask on a wafer through a projection system, thereby forming an optical image of the periodic mask pattern on the wafer, wherein when a period L of the period mask pattern on an image plane of the projection system is not more than a value obtained by doubling an exposure wavelength $\lambda$ of the illumination light source and dividing the resultant value by a numerical aperture of the projection system, exposure is performed by continuously irradiating the illumination light having a coherency of not more than 0.3 on the photomask until the wafer at a predetermined first position is moved to a second position in an optical axis direction by an integer multiple of $\Delta=\lambda/[2\{1-(1-\lambda^2/L^2)^{1/2}\}]$, thereby forming a periodic pattern having a period ½ the period L on the wafer.

Moreover, according to the present invention, there is provided a projection exposure method of irradiating illumination light from an illumination light source onto a photomask made of a transparent substrate having a periodic mask pattern formed thereon, and projecting the resultant transmitted light from the photomask on a wafer through a projection system, thereby forming an optical image of the periodic mask pattern on the wafer, wherein when a period L of the period mask pattern on an image plane of the projection system is not more than a value obtained by doubling an exposure wavelength $\lambda$ of the illumination light source and dividing the resultant value by a numerical aperture of the projection system, a main exposure operation is performed by irradiating illumination light having a coherency of not more than 0.3 on the photomask, and the wafer or an optical image of the periodic mask pattern is moved at least once, by ½ the period L for one movement, in a periodicity direction of the periodic mask pattern which is perpendicular to an optical axis of the illumination light source, thereby performing a sub-exposure operation at each position.

BRIEF DESCRIPTION OF THE DRAWINGS

FIGS. 2A, 2B, and 2C are sectional views and a graph which show a photomask and a created state of its pattern;

FIG. 6 is a graph showing an intensity distribution on an image projection plane;

FIGS. 13A and 13B are plan views showing amplitude distributions (diffracted light distributions) on the pupil plane of a projection lens when a lines and spaces pattern on a photomask is projected/exposed;

FIG. 17 is a plane view showing end portion of a lines and spaces pattern on a photomask;

FIG. 18 is a plane view showing end portion of a lines and spaces pattern on a photomask;

DETAILED DESCRIPTION OF THE PREFERRED EMBODIMENTS

The present invention will be briefly described first.

Figure 1:
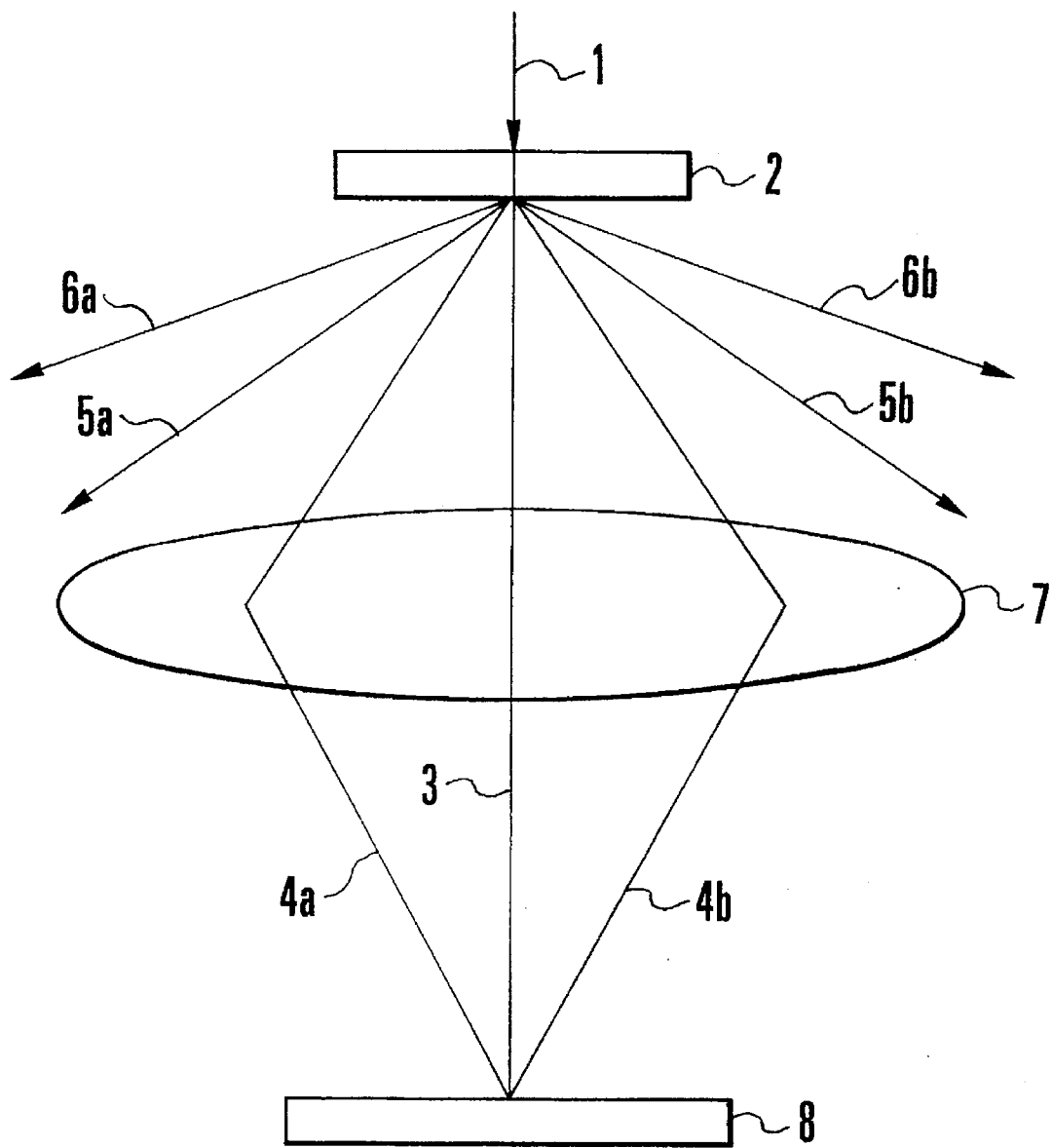
FIG. 1 is a sectional view showing an arrangement for a projection exposure operation according to the present invention.

FIG. 1 shows an arrangement for a projection exposure operation.

Referring to FIG. 1, reference numeral 1 denotes illumination light; 2, a photomask; 3, a 0th-order diffracted light beam transmitted through the photomask 2; 4a, a 1st-order diffracted light beam of the illumination light 1 which is transmitted through the photomask 2; 4b, a −1st-order diffracted light beam of the illumination light 1 which is transmitted through the photomask 2; 5a, a 2nd-order diffracted light beam; 5b, a −2nd-order diffracted light beam; 6a, a 3rd-order diffracted light beam; 6b, a −3rd-order diffracted light beam; 7, a projection lens for projecting/ exposing pattern light transmitted through the photomask 2; and 8, an image projection plane on which the pattern on the photomask 2 is projected through the projection lens 7.

When the illumination light 1 is vertically incident on the lines and spaces pattern on the photomask 2, the 0th-order diffracted light beam 3, the ±1st-order diffracted light beams 4a and 4b, and diffracted light beams of higher orders, such as the ±2nd-order diffracted light beams 5a and 5b, and the ±3rd-order diffracted light beams 6a and 6b are generated, as shown in FIG. 1.

When these diffracted light beams interfere with each other on the image projection plane 8 after passing through the projection lens 7, a lines and spaces pattern on the photomask 2 is imaged/formed on the image projection plane 8. As is apparent from FIG. 1, the diffracted light beams of higher orders do not pass through the projection lens 7 and hence do not contribute to pattern formation on the image projection plane.

As the pitch of the lines and spaces pattern decreases, the diffraction angle of diffracted light increases. For this reason, in a vertical incident illumination condition, a lines and spaces pattern having a size of 0.5 λ/NA or less is not formed.

Consider a case wherein a lines and spaces pattern having a pattern size L (pattern pitch 2L) of 0.5 λ/NA to 1.0 λ/NA is to be projected and exposed.

When a lines and spaces pattern serving as an area having a size of 0.5 λ/NA to 1.0 λ/NA is illuminated with vertical incident light, 0th- and ±1st-order light beams are transmitted through the projection lens to form an optical image on the image projection plane.

In this case, the intensity on the image projection plane is given by equation (1):

$$I(x,z) = |U(x,z)|^2 \quad (1)$$

$$= |a0e^{ik_0z} + a1e^{ikx+ik'z} + a1e^{-ikx+ik'z}|^2$$

$$= |a0 + 2a1e^{i(k'-k_0)z}\cos kx|^2$$

$$= a0^2 + 4a0a1\cos kx\cos(k0-k')z + 4a1^2\cos^2 kx$$

$$= (a0^2 + 2a1^2) + 4a0a1\cos kx\cos(k0-k')z + 2a1^2\cos 2kx$$

where $x$ is a position on the image projection plane, $z$ is defocus, $U(x, z)$ is the amplitude of light on the image projection plane, $a0$ and $a1$ are the amplitudes of 0th- and ±1st-order diffracted light beams, $k0$ is the wave number of illumination light, $k$ is the $x$ component of the wave number of the 1st-order diffracted light, and $k'$ is the $z$ component of the wave number of the 1st-order diffracted light.

In this case, the second term of equation (1) represents an optical image having a period $2L$ equal to the pitch of the mask pattern. The second term of equation (1) is generated by the interference between the 0th-order diffracted light beam and the 1st-order diffracted light beam (or the −1st-order diffracted light beam) and is dependent on the defocus $z$.

The third term of equation (1) represents an optical image having a period $L$ corresponding to ½ the pitch of the mask pattern. The third term of equation (1) is formed by the interference between the 1st-order diffracted light beam and the −1st-order diffracted light beam and is not dependent on the defocus $z$.

In order to eliminate the defocus dependence, the second term of equation (1) may be eliminated. In order to eliminate the second term, an optical image $I(x, z+\Delta)$ obtained by shifting the focus position by an amount $\Delta$ which satisfies $(k0-k')\Delta=\pi$ may be superimposed on an optical image $I(x, z)$ obtained when the above image plane is set as an image projection plane. Note that the optical image $I(x, z+\Delta)$ is expressed by equation (2):

$$\begin{aligned}I(x,z+\Delta) &= (a0^2 + 2a1^2) + \\ &\quad 4a0a1\cos kx\cos((k0-k')(z+\Delta)) + \\ &\quad 2a1^2\cos 2kx \\ &= (a0^2 + 2a1^2) - \\ &\quad 4a0a1\cos kx\cos(k0-k')z + 2a1^2\cos 2kx\end{aligned} \quad (2)$$

The intensity on the image projection plane after the image superimposition, therefore, is given by:

$$I(x, z)+I(x, z+\Delta)=2(a0^2+2a1^2)+4a1^2\cos 2kx \quad (3)$$

In performing the image superimposition, exposure is performed once with the defocus $z$, and exposure is performed again after the wafer is moved in the optical axis direction by the amount $\Delta$. In another method, the image plane of the projection system is shifted in the optical axis direction to relatively shift the wafer in the optical axis direction by the amount $\Delta$, and exposure is performed again afterward.

In this manner, a photoresist to be exposed absorbs light represented by $I(x, z)+I(x, z+\Delta)$ so that a lines and spaces image having a pattern pitch $L$ can be formed without any dependence on the defocus $z$.

The second term of equation (1) can also be eliminated by either of the following methods:

① Equation (1) is integrated with respect to $z$ by an integer multiple of $\Delta$.

② An optical image $I(x+\pi/k, z)$ obtained by shifting equation (1) with respect to $x$ by an integer multiple of $\pi/k$ is added to an optical image $I(x, z)$.

As described above, in the present invention, the 0th-order diffracted light beam 3 and the ±1st-order diffracted light beams 4a and 4b generated by the photomask 2 are projected on the image projection plane 8, and the 0th-order diffracted light beam 3 and the 1st-order diffracted light beam 4a (or the −1st-order diffracted light beam 4b) are caused to interfere with each other.

Subsequently, the intensity distribution (the second term of equation (1)) of the optical image having a pitch equal to the pitch of an image of the mask pattern on the photomask 2 which is formed on the image plane by this interference is eliminated by the above method. With this operation, an optical image having a pitch ½ the mask pattern pitch on the image plane is formed on the image projection plane 8 without any dependence on the defocus $z$.

FIGS. 2A and 2B show a photomask and a state in which a pattern is created. Referring to FIG. 2A, reference numeral 21 denotes a photomask; 22, a resist pattern formed by a conventional method using the photomask 21; and 23, a wafer. Referring to FIG. 2B, reference numeral 22a denotes a resist pattern formed by the method of the present invention using the photomask 21.

FIG. 2C shows intensity distributions on the image projection plane. Reference numeral 24 denotes an intensity distribution based on the conventional exposure method using the photomask 21; and 25, an intensity distribution based on the present invention using the photomask 21.

As shown in FIGS. 2A to 2C, according to the present invention, a lines and spaces pattern having a pitch ½ that of a pattern formed by the conventional method can be formed.

Since diffracted light beams are symmetrical about the optical axis except for those in method ② described above, no pattern exhibits a directional dependence unlike the case wherein modified illumination is used.

The important condition of the method of the present invention is to perform exposure while three beams, i.e., the 0th- and ±1st-order diffracted beams are caused to interfere with each other.

If the incident angle of illumination light with respect to a mask is larger, since the focus position dependence of the phase of a 1st-order diffracted light beam is not equal to that of a −1st-order diffracted light beam, the second term of equation (1) cannot be eliminated completely. For this reason, illumination light must be vertically incident on the mask. For this purpose, the coherency of illumination light must be set to be 0.3 or less.

The above conventional multiple exposure method is not effective in increasing the depth of focus of a lines and spaces pattern and reducing the size of a pattern. In contrast to this, in the method of the present invention, a fine period pattern, which cannot be obtained by a general exposure method, can be formed with a theoretically infinite depth of focus in the condition of light beams interfere with each other.

Embodiments of the present invention will be described below with reference to the accompanying drawings.

First Embodiment

The first embodiment will be described below, in which a lines and spaces pattern with a pitch of 0.50 $\lambda$/NA is formed by using a projection lens having an exposure wavelength $\lambda$, a numerical aperture NA, and a magnification of X1/5.

In the first embodiment, illumination was performed by vertical incidence of coherent light, and a lines and spaces pattern having a pitch of 1.0 $\lambda$/NA on the image plane was used as a mask pattern.

A shift amount $\Delta$ of the focus position is given by equation (4). In this case, a value obtained by multiplying the mask pattern pitch on the mask plane by the magnification (reduction projection ratio) is represented by L.

$$\Delta = \lambda/[2\{1-(1-NA^2k^2)^{1/2}\}]$$

$$k = \lambda/NA/L \quad (4)$$

That is, in the first embodiment, k=1.0 may be substituted into equation (4).

In practice, for example, either Krf exposure (excimer laser source: wavelength=0.248 μm) with NA=0.5 or g-line exposure with NA=0.5 is performed. When a 0.125-μm lines and spaces pattern is to be formed by performing KrF exposure with NA=0.5, Δ=0.933 μm. When a 0.218-μm lines and spaces pattern is to be formed by performing g-line exposure with NA=0.5, Δ=1.627 μm.

A case wherein a 0.218-μm lines and spaces pattern was formed on a wafer by performing g-line exposure with NA=0.5 and using a 2.18-μm lines and spaces pattern on a photomask will be described first.

In general, a high-resolution g-line resist which is sensitive to the g-line increases in transmittance with respect to exposure light upon irradiation of the exposure light. In this case, the g-line resist TSMRv3 (available from Tokyo Ohka Kogyo Co., LTD.)whose transmittance changes by about 30% was used.

First of all, the mask pattern was subjected to the first exposure (main exposure). The substrate (wafer) was then moved in the optical axis direction by Δ=1.627 μm and was subjected to the second exposure (sub-exposure).

Figure 3:
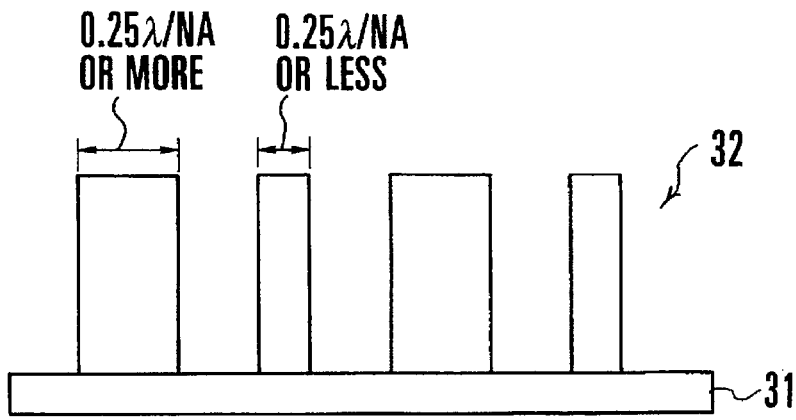
FIG. 3 is a sectional view showing a resist pattern formed when the first and second exposure operations are performed at the same dose.

FIG. 3 shows a resist pattern 32 formed on a wafer 31 when the first and second exposure operations are performed at the same dose. As shown in FIG. 3, when the dose of the second exposure is set to be equal to that of the first exposure, lines are thinned every other line of the resist pattern 32. This phenomenon will be explained as follows.

After the first exposure, the transmittance of the photoresist increases. For this reason, in the second exposure, the exposure light reaches a deeper portion of the photoresist, and the exposure light which sensitizes the photoresist to form a pattern increases in amount as compared with the first exposure. As a result, an intensity distribution having the same pitch as that of the mask pattern on the image plane is left without being completely canceled out.

In the above case, an optical image is formed by the superimposition of the intensity distribution with the same pitch as that mask pitch which is left without being completely canceled out and the intensity distribution with a pitch of ½ the mask pitch. For this reason, the resist pattern 32 is not a lines and spaces pattern having a uniform line width.

In order to form a lines and spaces pattern having a uniform line width, the doses in the first and second exposure operations were adjusted, and exposure was performed in the same manner as described above. For example, in performing exposure in the same manner as described above, the above g-line resist was used, and the ratio between the doses in the first and second exposure operations was set to be about 1.3:1.

Figure 4:
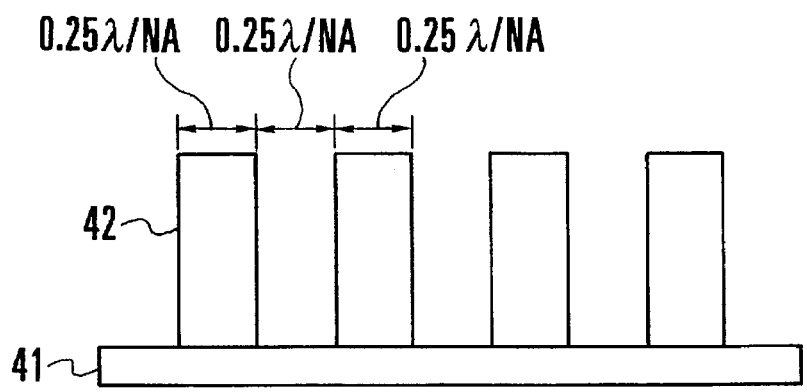
FIG. 4 is a sectional view showing a lines and spaces pattern having a uniform line width according to the present invention.

As a result, as shown in FIG. 4, a 0.218-μm (0.25 λ/NA) lines and spaces pattern 42 having a uniform line width was formed on a wafer 41.

A case wherein a KrF excimer laser beam was used with NA=0.5 will be described next. In this case, a 1.25-μm lines and spaces pattern was formed on the photomask, and a 0.125-μm lines and spaces pattern was formed by using this photomask. As a photoresist, the chemically amplified resist SEPR (available from Shin-Etsu Chemical Co., Ltd.) was used. The SEPR changes in transmittance by 10% or less upon irradiation of exposure light. For this reason, unlike the case of g-line exposure, even when the first and second exposure operations were performed at the same dose, a 0.125-μm lines and spaces pattern having a uniform line width could be formed.

In either of the above cases of g-line exposure and KrF exposure, a pattern having a uniform line width could be formed by properly selecting a light source and a photoresist. It was confirmed that this applied to i-line exposure and ArF exposure using an ArF excimer laser with a wavelength of 0.193 μm as a light source. That is, an i-line exposure or ArF exposure operation, an optical image formed by the method of the first embodiment described above is completely independent of the focus position. A lines and spaces pattern having a pitch of 0.50 λ/NA with a great depth of focus, which cannot be obtained by the general method, can be formed without any dependence on the periodicity direction of this periodic pattern.

When the second exposure operation was performed after the substrate was shifted in the optical axis direction by −Δ, a lines and spaces pattern having a pitch of 0.50 λ/NA with a great depth of focus, which could not be obtained by the general method, was formed, as in the above case.

In the above case, exposure is performed after the wafer is moved in the optical axis direction. The same effects as those described above, however, can be obtained by using a method of moving the image plane of an optical image. The image plane is moved by moving at least one or both of the mask and the projection lens in the optical axis direction. In addition, the image plane can be moving by inserting a transparent substance having a refractive index different from that of air in the optical path or changing the atmospheric pressure in the projection system.

Second Embodiment

In the first embodiment, a pattern is formed by a total of two exposure operations, i.e., a main exposure operation and a sub-exposure operation. However, the present invention is not limited to this. The same effects as those of the first embodiment can be obtained by three or more exposure operations.

A case wherein a photoresist whose transmittance changes by 10% or less upon irradiation of exposure light is used, and three or more exposure operations are performed will be described below. As in the first embodiment, even if a photoresist whose transmittance greatly changes upon irradiation of exposure light is used, the same effects as those described can be obtained.

In performing exposure three times, for example, shift amounts 0, Δ, and 2Δ are set with respect to the focus position, and the total dose corresponding to the shift amounts 0 and 2Δ is set to be equal to the dose corresponding to the shift amount Δ.

With this setting, in the second embodiment as well, no dependence on a defocus z was recognized. Similar to the first embodiment, in the second embodiment, as shown in FIG. 4, a fine resist pattern, which could not be obtained by the general method, was formed with a great depth of focus.

In performing exposure four times, shift amounts 0, Δ, z, and z+Δ are set with respect to the focus position, and the doses corresponding to the shift amounts 0 and Δ are set to be equal and the doses corresponding to the shift amount z and z+Δ are set to be equal.

In this case as well, similar to the first embodiment, a fine resist pattern like the one shown in FIG. 4, which could not be obtained by the general method, was formed with a great depth of focus.

As described above, when exposure is to be performed three or more times, shift amounts and doses may be determined to satisfy equations (5), provided that the shift amounts in the optical axis direction are respectively represented by d1 (=0), d2, ..., dn (n: the number of times of exposure), and the doses are respectively represented by E1, E2, E3, ..., En:

$\Sigma Ei \cos (k0-k')di = 0$ (i=1 to n)

$\Sigma Ei \sin (k0-k')di = 0$ (i=1 to n) (5)

When exposure was performed under such exposure conditions, a fine resist pattern, which could not be obtained by the general method, was formed with a great depth of focus, as shown in FIG. 4.

Third Embodiment

In the first and second embodiments, exposure is performed while the focus is discontinuously changed to integer multiples of Δ. However, the present invention is not limited to this. For example, a wafer may be continuously moved from the position in the main exposure operation in the optical axis direction by a distance corresponding to an integer multiple of Δ, and exposure (sub-exposure) may be continued while the wafer is moved in this manner. When a photoresist which undergoes a small change in transmittance upon irradiation of exposure light (e.g., the chemically amplified resist SEPR) is to be used, exposure may be performed while a wafer is continuously moved at a constant speed in the optical axis direction by a distance corresponding to an integer multiple of Δ.

By this method, as shown in FIG. 4, a fine resist pattern, which could not be obtained by the general method, could be formed with a great depth of focus.

In contrast to this, assume that a photoresist which undergoes a large change in transmittance upon irradiation of exposure light (e.g., the g-line resist TSMRv3) is used. In this case, if main exposure and sub-exposure are continuously performed while a wafer is continuously moved at a constant speed by a distance corresponding to an integer multiple of Δ, a pattern of alternate thick and thin lines is formed. This phenomenon occurs because the transmittance of the photoresist changes during exposure, and an intensity distribution having the same pitch as that of the mask pattern is left without being completely canceled out.

Figure 5:
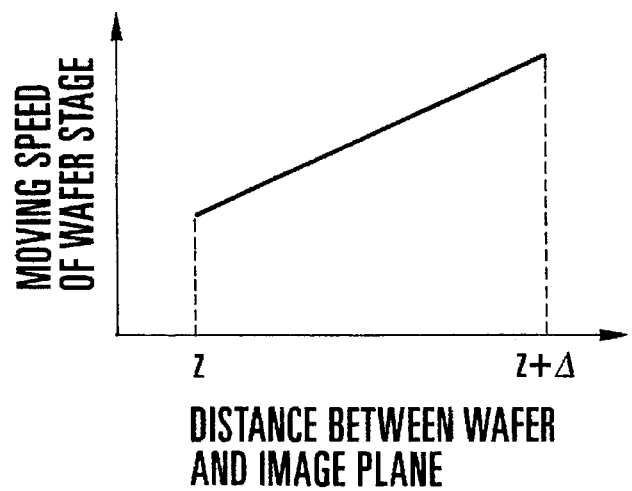
FIG. 5 is a graph showing the moving speed of a wafer during exposure.

For this reason, as shown in FIG. 5, in order to form a lines and spaces pattern having a uniform line width, exposure is performed while the moving speed of the wafer is gradually increased during the exposure.

As a result, as shown in FIG. 4, a fine lines and spaces resist pattern having a uniform line width, which could not be obtained by the general method, could be formed with a great depth of focus.

Fourth Embodiment

In the first, second, and third embodiments described above, the second term of equation (1) is eliminated by moving the image plane or the wafer in the optical axis direction. In the fourth embodiment, however, the second term of equation (1) is eliminated by moving the wafer in the periodicity direction of the pattern. In this case, a lines and spaces pattern having a pitch of 5.0 λ/NA was used as a mask pattern, and coherent light was vertically irradiated on the pattern. On a wafer, on which an image is projected, a lines and spaces pattern having a pitch of almost 5.0 λ/NA is formed.

The pattern was exposed once at a predetermined position. Thereafter, the wafer was moved in the periodicity direction of the pattern by 0.5 λ/NA, and exposure was performed again.

As a result, a lines and spaces pattern having a pitch of 5.0 λ/NA and a great depth of focus was formed. In this case, however, the same effects as those described above could not obtained with respect to a pattern exhibiting periodicity in a direction perpendicular to the moving direction.

In the fourth embodiment, the pattern was formed by performing a total of two exposure operations, i.e., the main exposure operation and the sub-exposure operation. However, a pattern could be formed by performing three or more exposure operations (the wafer was moved by 0.5 λ/NA for each exposure operation).

In these methods, similar to the first and second embodiments, when a photoresist which underwent a large change in transmittance upon irradiation of exposure light was used, a lines and spaces pattern having a uniform line width was formed by adjusting the dose at each exposure position.

When a photoresist which underwent a small change in transmittance upon irradiation of exposure light was used, a lines and spaces pattern having a uniform line width could be formed by setting the same dose at the respective exposure positions.

According to the fourth embodiment, a fine pattern could be formed by performing exposure while moving the wafer in the periodicity direction of a periodic pattern to be formed, as described above, without changing the illumination of the exposure apparatus in accordance with the direction of the pattern, unlike the conventional method using modified illumination.

Fifth Embodiment

A method of improving the contrast of an optical image of a pattern in the above exposure method of the present invention will be described below.

A contrast C of a lines and spaces pattern is given by equation (6):

$C = (Imax - Imin)/(Imax + Imin)$ (6)

where Imax and Imin are the intensities of the space portion and portion line of an optical image, respectively.

Since Imax and Imin correspond to the values obtained by substituting $\cos kx = \pm 1$ into equation (3), the contrast C is given by equation (7):

$C = (2a1^2)/(a0^2 + 2a1^2)$ (7)

That is, the contrast can be increased by decreasing an amplitude a0 of the 0th-order diffracted light or increasing an amplitude a1 of the 1st-order diffracted light.

The ratio a1/a0 can be increased by decreasing the width of the spaces on the photomask as compared with the line width of the lines, although the optical image itself becomes dark because of a decrease in the amount of transmitted light.

In a general lines and spaces pattern with a ratio of 1:1 (space width: line width), the ratio a1/a0 is about 0.64, and hence the contrast is 0.45. In a lines and spaces pattern with a ratio of 1:3, the ratio a1/a0 is about 0.90, and hence the contrast is improved to 0.62.

FIG. 6 shows an intensity distribution on the image projection plane in the above case.

As is apparent from FIG. 6, the contrast is improved as compared with the result shown in FIG. 2C. By using such a lines and spaces pattern with a thin space portion, i.e., a mask with which the amplitude a0 of the 0th-order diffracted light is 0.64 times or more the amplitude a1 of the 1st-order diffracted light, a pattern like the one shown in FIG. 4 could be formed with a larger margin of dose than in the case wherein the general lines and spaces pattern with a ratio of 1:1 in the first embodiment is used.

As a method of increasing the ratio a1/a0, a method using a halftone phase-shifting mask whose light-shielding portion has a specific transmittance and a specific phase and transmits light will be described.

When the halftone phase-shifting mask is used, the transmittance of the mask decreases, i.e., the amplitude a0 decreases, owing to the phase inversion effect of the light-shielding portion. For this reason, even if a lines and spaces pattern with a ratio of 1:1 is used, the amplitude a1 of the 1st-order diffracted light becomes larger than 0.64 times the amplitude a0 of the 0th-order diffracted light, unlike the case wherein a transmission mask is used.

For this reason, a pattern like the one shown in FIG. 4 could be formed with a larger margin of dose than in the case wherein a transmission mask having a general lines and spaces pattern having a ratio of 1:1 in the first embodiment is used.

When a halftone phase-shifting mask is to be used, the contrast can be further improved by narrowing the space portion (light-transmitting portion) of the lines and spaces pattern.

By this method, a pattern like the one shown in FIG. 4 can be created/formed with a larger margin of dose than in the case wherein a transmission mask having a general lines and spaces pattern having a ratio of 1:1 in the first embodiment is used.

Sixth Embodiment

Figure 7:
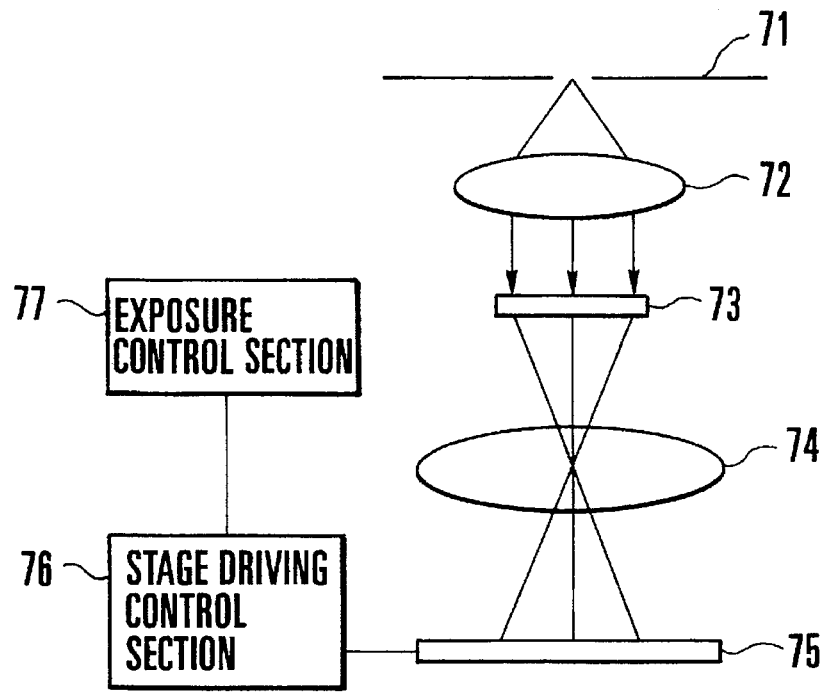
FIG. 7 is a block diagram showing the arrangement of a projection exposure apparatus for performing exposure according to an embodiment of the present invention.

FIG. 7 shows the basic arrangement of a projection exposure apparatus for performing the above exposure operations in the first to third embodiments.

In this projection exposure apparatus, the relative positions of a wafer and the image plane of a mask pattern are changed in the optical axis direction.

Referring to FIG. 7, reference numeral 71 denotes an aperture for forming light from a light source into a predetermined light beam; 72, a condenser lens for collimating illumination light passing through the aperture 71 into parallel light; 73, a photomask; 74, a reduction projection system; 75, a wafer stage on which a wafer is mounted; 76, a stage driving control section for controlling the operation of the wafer stage 75; and 77, an exposure control section for controlling the exposure time and the like.

The coherency of illumination light is set to be 0.3 or less by the aperture 71. The illumination light is collimated into parallel light by the condenser lens 72. The parallel light is then irradiated on the photomask 73. The illumination light passing through the photomask 73 is reduced at a predetermined reduction ratio by the reduction projection system 74 to project an optical image on the wafer stage 75. The exposure control section 77 calculates $\Delta$ from the period of a mask pattern input in advance according to equation (4), and sets at least two exposure positions shifted from each other by $\Delta$.

The stage driving control section 76 performs control on the basis of this information to perform exposure upon moving the wafer stage 75 to the respective exposure positions. In this case, since each exposure position error must be ±5% of $\Delta$, the wafer stage 75 is driven with a precision of 0.5 µm in the optical axis direction.

Seventh Embodiment

According to the projection exposure apparatus in FIG. 7, the above exposure method is realized by moving the wafer stage 75. However, either or both of the photomask 73 and the reduction projection system 74 may be moved in the optical axis direction.

Figure 8:
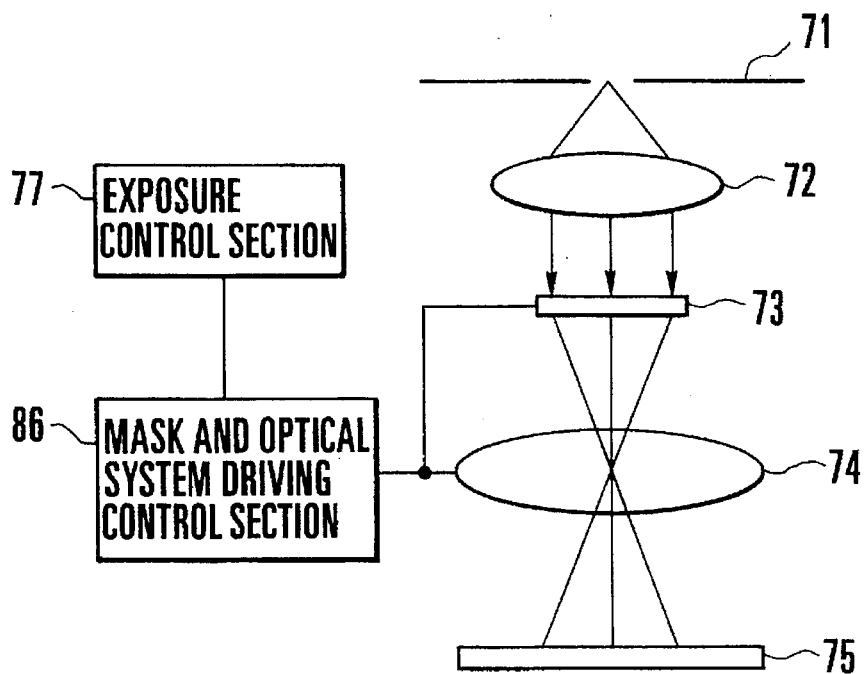
FIG. 8 is a block diagram showing the arrangement of a projection exposure apparatus according to another embodiment of the present invention.

FIG. 8 shows the arrangement of a projection exposure apparatus designed to move a photomask 73 and a reduction projection system 74 in the optical axis direction.

Referring to FIG. 8, reference numeral 86 denotes a mask and optical system driving control section for controlling the movement of the reduction projection system 74 in the optical axis direction. Other reference numerals in FIG. 8 denote the same parts as in FIG. 7. In this projection exposure apparatus in FIG. 8, an exposure control section 77 calculates $\Delta$ from a preset mask pattern pitch, and sets at least two exposure positions shifted from each other by $\Delta$. The mask and optical system driving control section 86 performs control on the basis of the above information to move the photomask 73 and the reduction projection system 74 in the optical axis direction.

With this operation, the projection exposure apparatus can perform exposure while changing the focus position for each exposure operation or during exposure.

As described above, the same effects as those of the above embodiment can be obtained by using a projection exposure apparatus designed to change the relative positions of a wafer and the image plane of a mask pattern in the periodicity direction of the mask pattern instead of the optical axis direction.

In this projection exposure apparatus, similar to the projection exposure apparatus in FIG. 7, the period of a periodic mask pattern to be exposed is preset in the exposure control section, and the periodicity direction of the pattern is preset.

On the basis of the preset values of the period and the direction, the exposure control section sets at least two exposure positions shifted from each other by ½ the period in the periodicity direction.

This projection exposure apparatus includes a stage control section for finely controlling the wafer stage in the planar direction thereof. The first exposure operation is performed while the stage control section positions the wafer stage on the basis of information from the exposure control section as in a normal operation. Thereafter, the stage control section moves the wafer stage to a position shifted from the position in the first exposure operation by ½ the period in the periodicity direction.

After this movement, the exposure control section performs the second exposure operation.

Eighth Embodiment

In the seventh embodiment described above, a wafer or the exposure system is moved. However, the present invention is not limited to this. For example, the same effects as those described above can be obtained by inserting a transparent member having a refractive index different from that of an atmosphere in the optical path of exposure light.

In this method, a wafer is exposed once, and the second exposure operation is performed after a plane-parallel plate having a refractive index different from that of air is inserted in the exposure light optical path of the projection system to be perpendicular to the optical axis. With this operation, a pattern having a pitch ½ the pitch on the photomask can be formed with a practical depth of focus.

Letting n0 be the refractive index of an atmosphere in which exposure is performed, n1 be the refractive index of the plane-parallel plate, and $\lambda$ be the exposure wavelength, a thickness $\underline{d}$ of the plane-parallel plate is given as follows.

If the angle defined by a normal of the plane-parallel plate and incident light is represented by $\theta 0$, an angle $\theta 1$ of refraction satisfies n1sin$\theta$1=n0sin$\theta$0 according to the law of refractive index.

By using this angle $\theta 1$ of refraction, a change in optical path length upon insertion of the plane-parallel plate is expressed by $d(\sin\theta 0 \sin(\theta 0-\theta 1)+1)/\cos\theta 1 - 1/\cos\theta 0$.

In order to completely invert the contrast of the intensity distribution of the 1st-order diffracted light of the diffracted light emerging from the photomask by inserting the plane-parallel plate, the following two points are required.

First of all, the angle θ0 must be the incident angle of the ±1st-order diffracted light beams, and the change in optical path length must correspond to the phase difference between odd multiples of π.

For this reason, the thickness of the plane-parallel plate is $d=(m+\frac{1}{2})\lambda/((\sin\theta_0\sin(\theta_0-\theta_1)+1)/\cos\theta_1-1/\cos\theta_0)$ where $\underline{m}$ is 0 or a natural number.

If the plane-parallel plate is inserted between the photomask and the projection lens, the incident angle of the ±1st-order diffracted light beams is given by $\sin\theta_0=\lambda/Mp$. This is the case wherein the reduction ratio in projection exposure is 1/M, and the pattern pitch on the mask is Mp.

If the plane-parallel plate is inserted between the projection lens and the image projection plane, the incident angle of the ±1st-order diffracted light beams is given by $\sin\theta_0=\lambda/p$.

As described above, when the method of inverting the contrast of the intensity distribution of the 1st-order diffracted light by using the plane-parallel plate having the thickness $\underline{d}$ was used under the following conditions, a fine pattern could be formed with a practical depth of focus.

In forming a 0.125-μm lines and spaces pattern by using a reduction projection system having a reduction ratio of 1/5 and NA=0.5 and a KrF excimer laser as a light source, the second exposure is to be performed after a quartz plate having a refractive index of 1.5 with respect to the exposure wavelength and a thickness of 231.4 μm is inserted between the reduction projection system and the photomask.

Figure 9A:
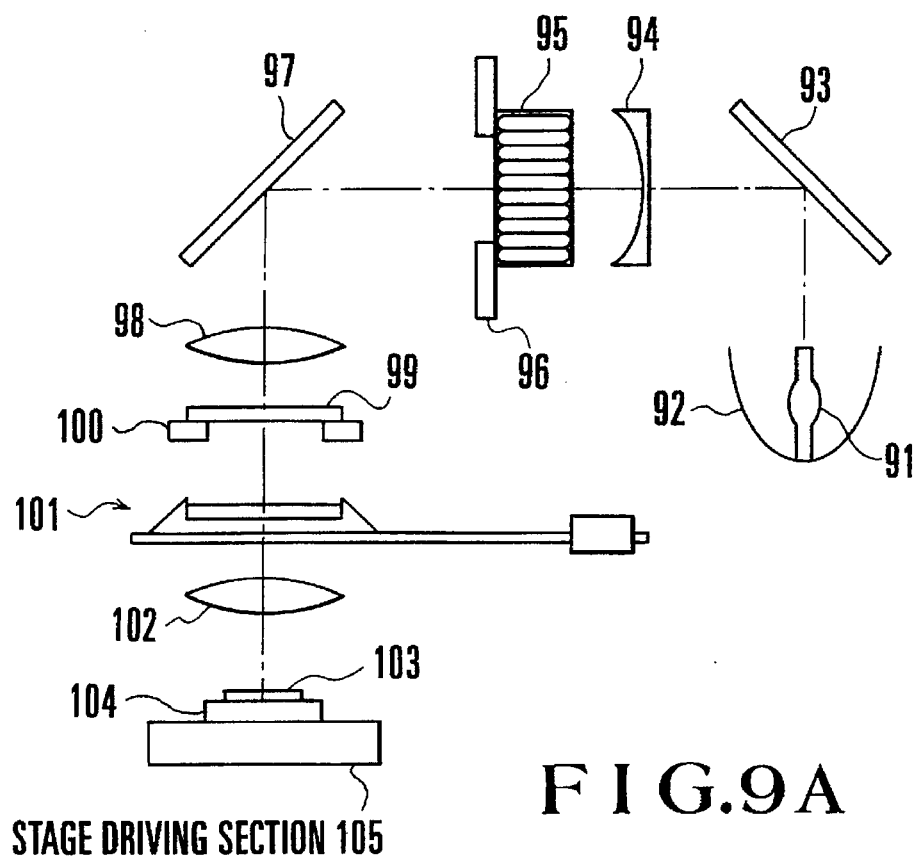
FIGS. 9A and 9B are views showing the arrangement of a projection exposure apparatus according to the present invention, in which a transparent member having a refractive index different from that of an atmosphere is inserted.
Figure 9B:
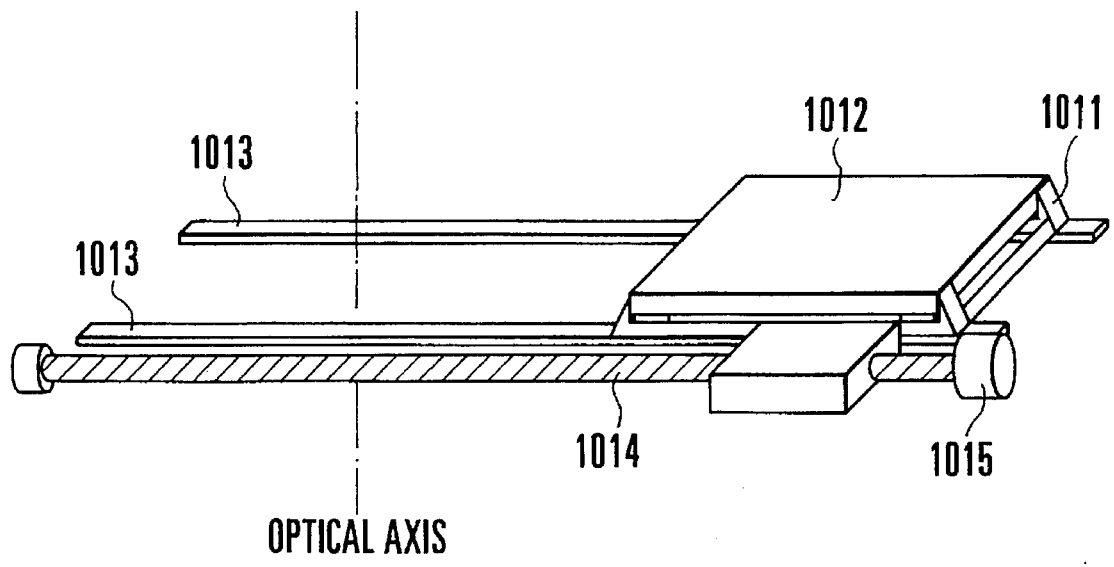

FIGS. 9A and 9B show the arrangement of a projection exposure apparatus for performing projection exposure by using a plane-parallel plate in the eighth embodiment.

Referring to FIGS. 9A and 9B, reference numeral 91 denotes a lamp for emitting ultraviolet rays; 92, an elliptic mirror; 93, a first mirror; 94, a collimator lens; 95, a fly-eye lens; 96, an illumination aperture; 97, a second mirror; 98, a condenser lens; 99, a photomask; 100, a mask holder; 101, a plane-parallel plate insertion mechanism for inserting/removing a plane-parallel plate made of a transparent member having a refractive index different from that of air; 102, a projection lens; 103, a wafer; 104, a wafer stage; and 105, a stage driving section for moving the wafer stage 104.

In this embodiment, ultraviolet rays emitted from the lamp are used. However, the present invention is not limited to this. As is apparent, a laser source can be used.

Illumination light guided by the first mirror 93 is focused on the fly-eye lens 95 by the collimator lens 94.

The illumination light, whose illuminance irregularity has been reduced by the fly-eye lens 95, is limited in range by the illumination aperture 96. As a result, the coherency of the light is set to be 0.3 or less.

FIG. 9B shows the detailed arrangement of the plane-parallel plate insertion mechanism 101.

Referring to FIG. 9B, a plane-parallel plate 1012 is mounted on a holder 1011 to be perpendicular to the optical axis of the projection exposure system. The holder 1011 is arranged to smoothly move on rails 1013. The rails 1013 are arranged within a plane perpendicular to the optical axis. The holder 1011 moves on the rails 1013 upon rotation of a driving motor 1015 for a ball screw 1014.

Since the distance between the outer side of one rail 1013 and that of the other rail 1013 is larger than the widths of the projection lens 102 and the photomask 99, no image of the rails 1013 is reflected in the image projection plane. While the plane-parallel plate 1012 is not inserted, the holder 1011 retreats to a position where its image is not reflected in the image projection plane.

In this projection exposure apparatus, an exposure control section (not shown) calculates Δ from a preset mask pattern pitch, and sets at least two exposure positions shifted from each other by Δ in the optical axis direction. The plane-parallel plate insertion mechanism 101 then inserts the plane-parallel plate 1012 having a thickness corresponding to Δ into the optical axis on the basis of the above information.

Ninth Embodiment

In the example, of the eighth embodiment described above, which is shown in FIGS. 9A and 9B, the plane-parallel plate is inserted between the photomask and the projection lens. However, the present invention is not limited to this.

Figure 10A:
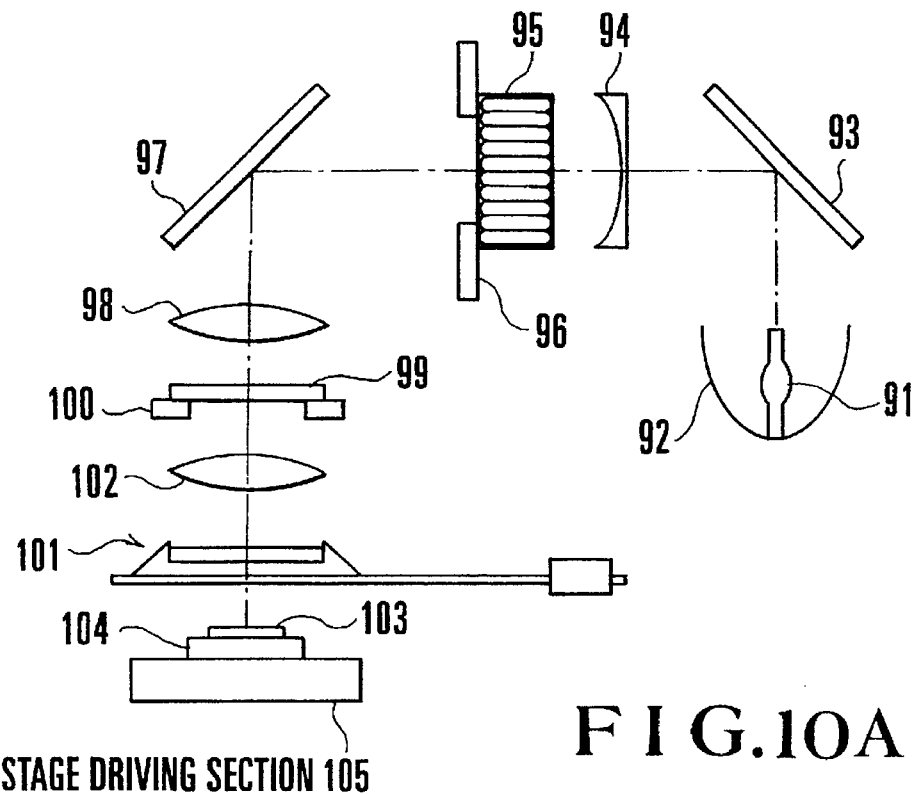
FIGS. 10A and 10B are views showing the arrangement of a projection exposure apparatus according to another embodiment of the present invention, in which a transparent member having a refractive index different from that of an atmosphere is inserted.

As shown in FIG. 10A, the plane-parallel plate insertion mechanism 101 may be arranged between the projection lens 102 and the wafer 103.

Tenth Embodiment

Figure 10B:
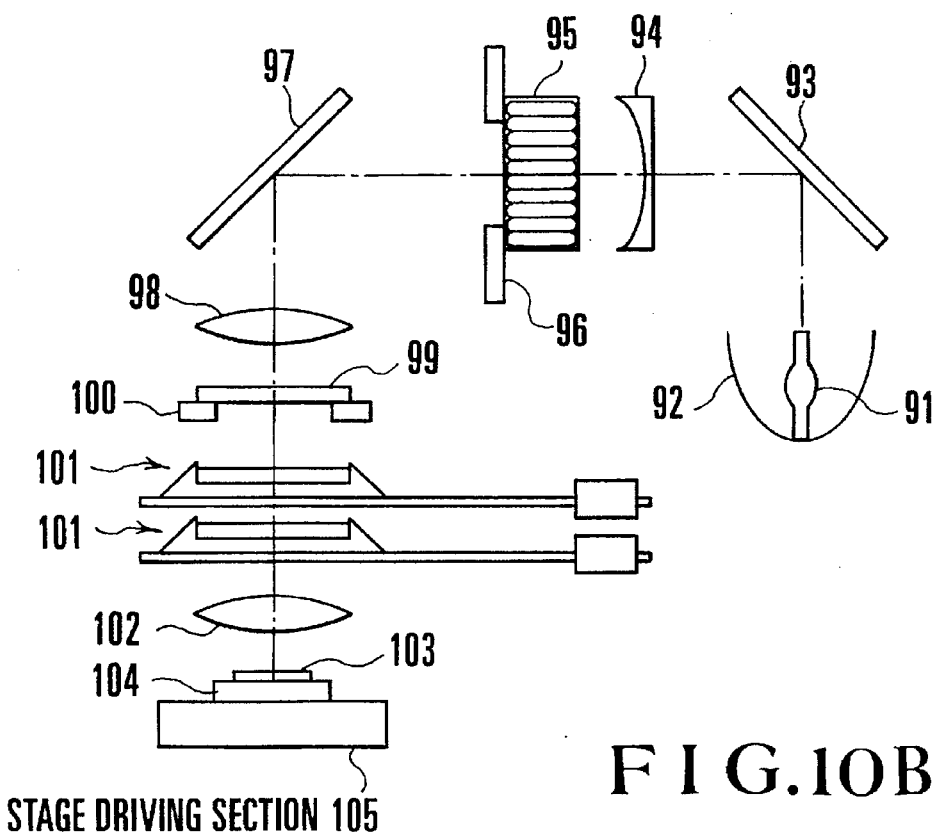

The number of plane-parallel plates to be inserted is not limited to one, and two or more plates may be inserted. FIG. 10B shows a state wherein two plane-parallel plates are inserted by using two independent plane-parallel plate insertion mechanisms 101.

According to the projection exposure apparatus shown in FIG. 10B, exposure can be performed while the focus is shifted three times by inserting one plane-parallel plate and the two plane-parallel plates.

A projection exposure apparatus may be designed to allow insertion of a plurality of plane-parallel plate having different thicknesses. With this projection exposure apparatus, the second exposure may be performed by inserting a plane-parallel plate corresponding to a mask pattern pitch.

Eleventh Embodiment

Figure 11:
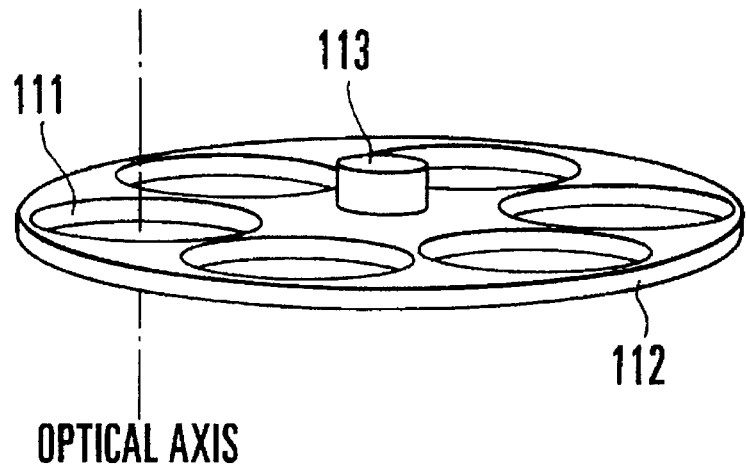
FIG. 11 is a perspective view showing another embodiment of a plane-parallel plate insertion mechanism in the projection exposure apparatus of the present invention.

FIG. 11 shows another form of the plane-parallel plate insertion mechanism.

In each of the ninth and tenth embodiments, the plane-parallel plate is reciprocated to be inserted in the optical axis of the projection exposure system. In the 11th embodiment, however, a plane-parallel plate is rotated to be inserted.

As shown in FIG. 11, plane-parallel plates 111 are arranged on a circular holder 112. The plane-parallel plate 111 is inserted in the optical axis by rotating the holder 112 using a driving motor 113. Note that since an opening portion of the holder 112 is larger in width than the photomask and the projection lens, no image of the holder 112 is reflected on the image projection plane.

Figure 12:
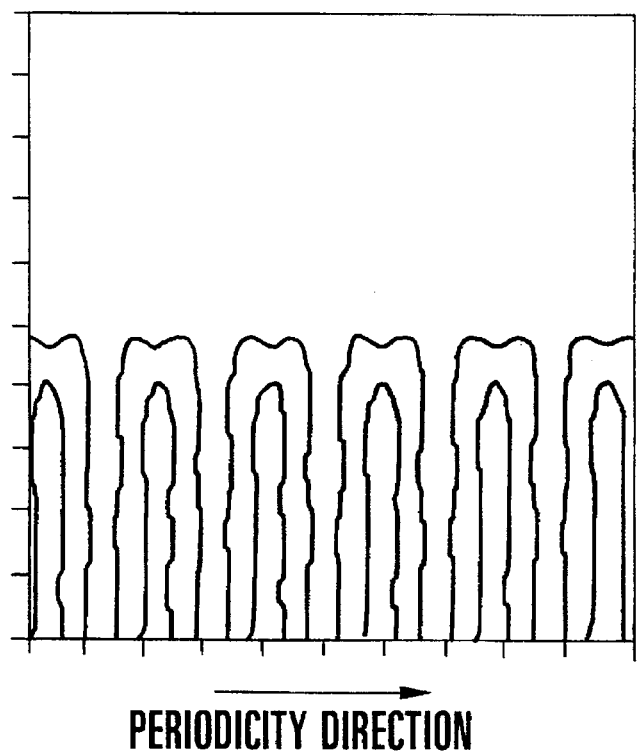
FIG. 12 is a plan view showing end portions of a striped pattern formed when exposure is performed at two positions shifted from each other by Δ in the direction of the optical axis.

As described above before the 11th embodiment, when a continuous striped pattern (lines and spaces pattern) is formed as it is, end portions of adjacent striped pattern elements are connected to each other without being isolated, as shown in FIG. 12.

For this reason, when such a pattern is applied to a circuit pattern such as an LSI pattern, limitations must be imposed on the circuit design. That is, limitations must be imposed on pattern shapes which can be formed.

This phenomenon indicates that the spatial frequency at the end portion of each striped pattern element is not twice the period of the pattern on the mask. That is, the spatial frequency at the end portion of each pattern element is not perfectly doubled, unlike an inner portion of the pattern.

This phenomenon will be described below with reference to light distributions on the pupil plane of the projection lens system.

When a lines and spaces pattern on a photomask is illuminated with coherent light, the 0th-order diffracted light beam, the ±1st-order diffracted light beams, ... are generated by the photomask to be symmetrical about the optical axis. If the pitch of the lines and spaces pattern on the photomask is 1.0 λ/NA to 2.0 λ/NA in terms of dimensions on the image plane, the three light beams, i.e., the 0th- and ±1st-order diffracted light beams, passed through the projection lens.

FIGS. 13A and 13B show amplitude distributions (diffracted light distributions) on the pupil plane of the projection lens when the lines and spaces pattern on the photomask is projected/exposed.

FIG. 13A shows a state wherein the length of a line is infinite, and no diffraction occurs at each pattern end portion. FIG. 13B shows a case wherein diffraction occurs at each pattern end portion. Referring to FIG. 13A, the direction in which the lines and spaces pattern exhibits periodicity is defined as the X direction. In addition, let $A_1'$ be the −1st-order diffracted light beam, $A_0$ be the 0th-order diffracted light beam, $A_1$ be the +1st-order diffracted light beam, and $B_0$, $B_1$, and $B_1'$ be the 0th-, 1st-, and −1st-order diffracted light distributions from end portions of the lines and spaces pattern.

In forming a pattern on the image projection plane by causing these three light beams to interfere with each other, the 0th-order diffracted light beam $A_0$ and the +1st-order diffracted light beam $A_1$ interfere with each other, and the 0th-order diffracted light beam $A_0$ and the −1st-order diffracted light beam $A_1'$ interfere with each other to form an optical image having the same period as that of the lines and spaces pattern on the photomask. An optical image having a period ½ the period of the lines and spaces pattern is formed by the interference between the ±1st-order diffracted light beams $A_1'$ and $A_1$. In this case, since the 0th-order diffracted light beam passed through the central portion of the pupil plane is different in angle with respect to the optical axis from the ±1st-order diffracted light beams, the phase change of the 0th-order diffracted light beam in the optical axis direction, i.e., the z component of the wave number, is different from that of the ±1st-order diffracted light beams.

For this reason, as described above, the intensity distribution formed by the interference between the 0th- and 1st-order diffracted light beams exhibits a focus dependence, but the intensity distribution formed by the interference between the ±1st-order diffracted light beams exhibits no focus dependence.

This method of doubling the spatial frequency is one of the characteristic features of the present invention. In the method, multiple exposure is performed to eliminate the influence of the 0th-order diffracted light to form an optical image having a pitch ½ the pitch of a mask pattern, i.e., a frequency twice the period of the pattern, without any dependence on the focus position. That is, the intensity distributions formed by the interference between the 0th- and +1st-order diffracted light beams and the interference between 0th- and −1st-order diffracted light beams are superimposed on each other, after the focus position is shifted, so as to be canceled out. With this operation, the intensity distribution formed by the interference between the ±1st-order diffracted light beams is extracted.

The present invention uses these methods, and the extracted intensity distribution becomes an optical image having a pitch ½ the pitch of the mask pattern, i.e., a spatial frequency twice the period the pattern without any dependence on a defocus.

If, however, diffraction occurs at each end portion of the lines and spaces pattern on the photomask, distributions $B_0$, $B_1$, and $B_1'$ extending on the pupil plane in the y-axis direction are obtained, as shown in FIG. 13B.

In the method of doubling a spatial frequency by multiple exposure, an optical image formed by the interference between a 0th-order diffracted light beam and 1st- or −1st-order diffracted light beam is canceled out, and an optical image formed by the interference between ±1st-order diffracted light beams is extracted.

Letting k0 be the wave number of an exposure wavelength, and kz be the z component of the wave number of a 1st-order diffracted light beam, the contrasts of an optical image formed by the interference between a 0th-order diffracted light beam and a 1st-order (or −1st-order) diffracted light beam are completely inverted if defocus occurs by $\Delta=\pi/(k0-kz)$. That is, the bright and dark portions of the optical image are exchanged with each other.

For this reason, exposure is performed twice with the focus being shifted by Δ to average the contrasts of the optical image, thereby completely canceling out the contrast of the optical image formed by the interference between the 0th- and 1st-order diffracted light beams each having the same spatial frequency as that of the pattern on the photomask.

The defocus amount Δ in this case is determined by the difference between the z components of the wave numbers of the 0th- and ±1st-order diffracted light beams, and is determined by diffracted light beams of the light beams $A_0$, $A_1$, and $A_1'$ (FIGS. 13A and 13B) to double the spatial frequency at each inner portion of the lines and spaces pattern as a periodic pattern.

In contrast to this, an optical image of an end portion of a lines and spaces pattern on the photomask is formed by the interference between diffracted light beams of the light beams $A_0$, $A_1$, and $A_1'$ having high intensities and the distributions $B_0$, $B_1$, and $B_1'$ of diffracted light beams from the pattern end portion.

Since the z component of the wave number of diffracted light is determined by the distance from the origin of the pupil plane, the z components of the wave numbers of the distributions $B_0$, $B_1$, and $B_1'$ are not constant values in the respective distributions.

For example, in the distribution $B_1$ of 1st-order diffracted light from a pattern end portion, the z component of the wave number continuously shifts from kz as the diffraction point separates from the light beam $A_1$.

That is, at an end portion of a lines and spaces pattern, an optical image is formed by the interference between diffracted light beams whose z components of the wave numbers have continuous values.

Unlike an inner portion of the lines and spaces pattern, therefore, the contrast of an optical image having the same spatial frequency as that of the pattern on the mask is not completely inverted when the focal position is shifted. For this reason, at an end portion of the lines and spaces pattern, the contrast of an optical image having the same spatial frequency as that of the pattern on the photomask is left when, for example, multiple exposure is performed with the defocus amount of Δ, as described above.

As a result, as shown in FIG. 12, at end portions of a lines and spaces pattern created to an image projection plane position, every other line is connected to its adjacent line.

Such a phenomenon occurs because the distributions $B_0$, $B_1$, and $B_1'$ of the diffracted light beams from line pattern end portions greatly extend on the pupil plane in the y-axis direction, and hence the z components of the respective wave numbers are greatly different from the diffracted light beams $A_0$, $A_1$, and $A_1'$ from the inner portions of the periodic pattern.

That is, if the diffracted light beams from the end portions of the lines and spaces pattern do not greatly extend on the pupil plane in the y-axis direction, and have almost the same wave numbers as those of the diffracted light beam from the inner portions of the pattern, the end portions of the lines and spaces pattern can be isolated from each other.

A state in which a diffracted light beam from an end portion of a lines and spaces pattern does not greatly extend on the pupil plane of the projection lens in a direction perpendicular to the periodicity direction of the pattern indicates that the NA is small with respect to a diffracted light beam in the line direction of the lines and spaces pattern. If, therefore, a change in transmittance at an end portion of the lines and spaces pattern is not steep, a state in which a diffracted light beam from the pattern end portion does not greatly extend on the pupil plane is realized. That is, isolation of the pattern end portions is realized when the transmittance at each end portion of the lines and spaces pattern gradually changes or the shape of each pattern end portion gradually changes.

Twelfth Embodiment

Figure 14A:
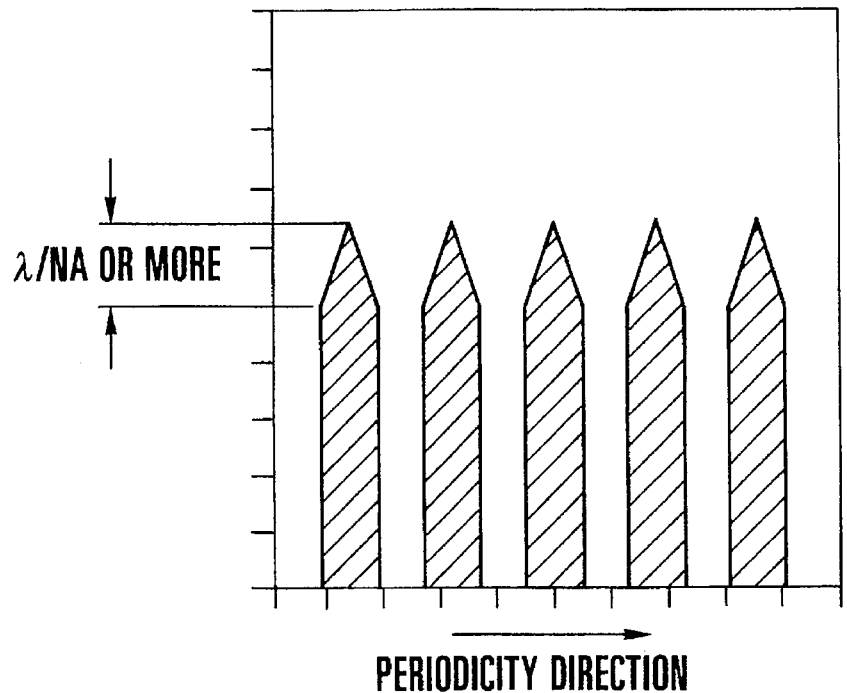
FIGS. 14A and 14B are plan views each showing end portions of a lines and spaces pattern on a photomask.
Figure 14B:
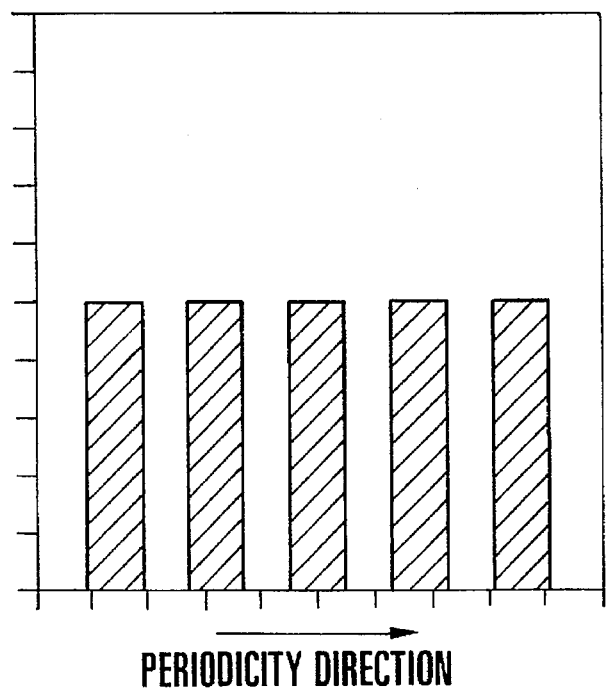

FIGS. 14A and 14B show end portions of lines and spaces patterns. FIG. 14A shows a case wherein the shape of each pattern end portion gradually changes. FIG. 14B shows a case wherein each pattern end is abruptly cut off as in the prior art.

As shown in FIG. 14A, if a lines and spaces pattern is formed on a photomask such that each end portion is tapered, diffraction in the line direction of the pattern can be reduced, and the spread of diffracted light beams from pattern end portions in the line direction can be suppressed.

As the change in the thickness of each end portion is made more gradual, the spread of diffracted light beams from the pattern end portions in the line direction can be suppressed more.

Assume that the length of an area undergoing a gradual change in pattern width is λ/NA or more. Almost no effect can be obtained below λ/NA.

Figure 15:
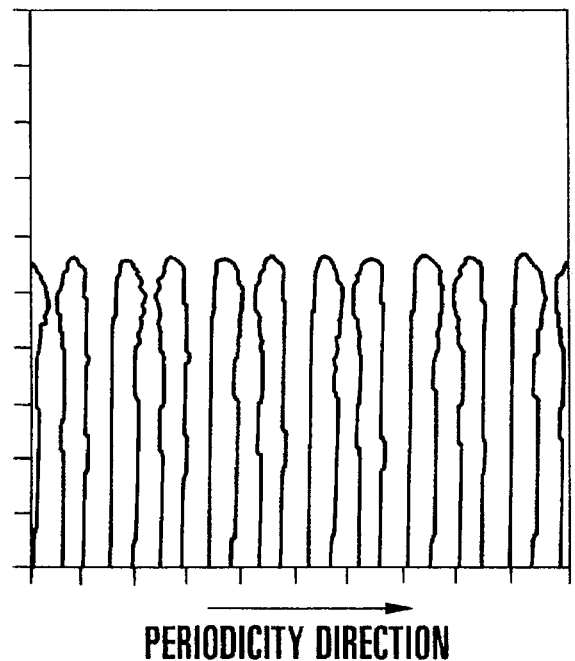
FIG. 15 is a graph showing intensity distributions on an image projection plane in a case wherein the photomask as the pattern in the embodiment of the present invention shown in FIG. 14A is used.

FIG. 15 shows intensity distributions on the image projection plane in a case wherein a photomask having a pattern like the one described above is used.

As is apparent from FIG. 15, the pattern end portions are completely isolated from each other, unlike the state shown in FIG. 12.

Thirteenth Embodiment

Figure 16:
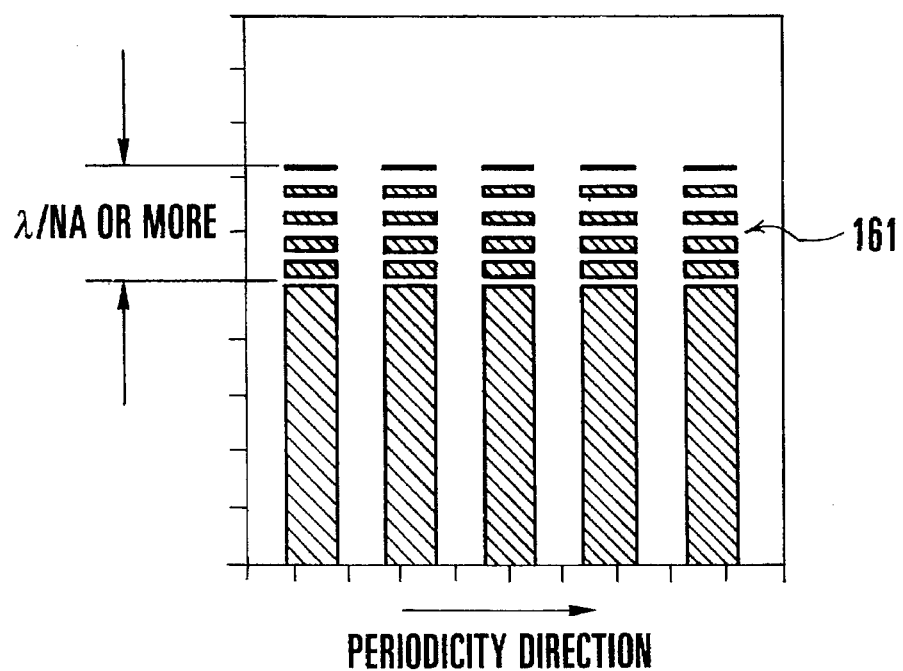
FIG. 16 is a plane view showing end portion of a lines and spaces pattern on a photomask.

In the 12th embodiment, each pattern end portion is tapered. However, the present invention is not limited to this. As shown in FIG. 16, striped areas 161 may be formed. In each striped area 161, light-shielding portions thicken with the gaps therebetween gradually decreasing from the end to a distance of λ/NA or more.

As shown in FIG. 17, halftone areas 171 may be formed such that each halftone area 171 extends from the end to a distance of λ/NA or more.

In order to prevent contact between the adjacent striped areas 161, the width of each striped area 161 must be set to be smaller than the period of the lines and spaces pattern.

The two forms shown in FIGS. 16 and 17 may be combined with each other. As shown in FIG. 18, halftone patterns 181 each having the same width as that of each element of the lines and spaces pattern may be formed such that the transmittance of each halftone pattern 181 gradually decreases from the end to a distance of λ/NA or more.

In this case, the pattern elements of each striped area may be arranged with the gaps therebetween gradually decreasing. Alternatively, the pattern elements of each striped area may gradually decrease in width from the end in the longitudinal direction of the lines and spaces pattern. These forms may be combined with each other.

That is, it suffices if the average transmittance obtained by averaging the transmittances of the lines and spaces pattern in the periodicity direction gradually increases toward each end in a direction perpendicular to the periodicity direction of the lines and spaces pattern.

In the 12th and 13th embodiments, in order to prevent the end portions of a periodic pattern (lines and spaces pattern) from being connected to each other when the pattern is created, the pattern end portions on the photomask are modified. However, the present invention is not limited to this.

In order to prevent the end portions of a pattern to be created from being connected to each other, the wave numbers of diffracted light beams, generated from the end portion of the lines and spaces pattern on the photomask, which propagate in a direction perpendicular to the periodicity direction of the periodic pattern may be regulated on the pupil plane of the projection system.

That is, a pupil filter for regulating light beams diffracted from the end portions of a lines and spaces pattern on a photomask in the stripe direction may be arranged on the pupil plane of the projection lens system.

The pupil filter serves to regulate the spread of diffracted light distributions from the end portions of the lines and spaces pattern on the pupil plane in the stripe direction, and suppress the difference between the $z$ component of the wave number of each diffracted light beam from the end portion of the lines and spaces pattern and that of a diffracted light beam from each inner portion of the periodic pattern to 10% or less.

With this operation, the contrast of an optical image having the same spatial frequency as that on the photomask is almost inverted on each pattern end portion on the image projection plane when the focus changes by Δ.

By performing multiple exposure with the focus being shifted by Δ as described above, the intensity of an optical image having the same spatial frequency as that on the photomask can be set to be 10% or less the intensity of an optical image having a spatial frequency twice that on the photomask.

As described above, even if a periodic pattern having a period ½ that of a periodic mask pattern on a photomask is formed on a wafer, the pattern end portions can be isolated from each other by using the above pupil filter.

Fourteenth Embodiment

An embodiment using the above pupil filter will be described below.

Figure 19:
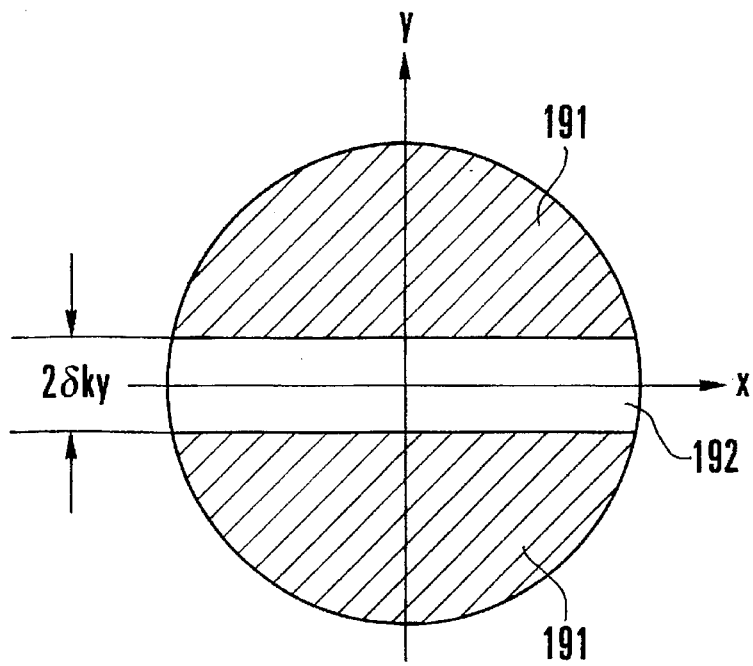
FIG. 19 is a plan view showing the arrangement of a pupil filter for regulating diffracted light in the stripe direction of a lines and spaces pattern formed in the present invention.

FIG. 19 shows the arrangement of the pupil filter for regulating diffracted light in the stripe direction of a lines and spaces pattern to be formed. Referring to FIG. 19, reference numeral 191 denotes a light-shielding portion; and 192, a light-transmitting portion. The x-axis corresponds to the periodicity direction of the periodic pattern. The y-axis corresponds to the stripe direction. An upper limit value $\delta k_y$ of the wave number of a light beam which can be transmitted through this pupil filter is 30% or less of the radius of the pupil plane of the projection lens.

Figure 20:
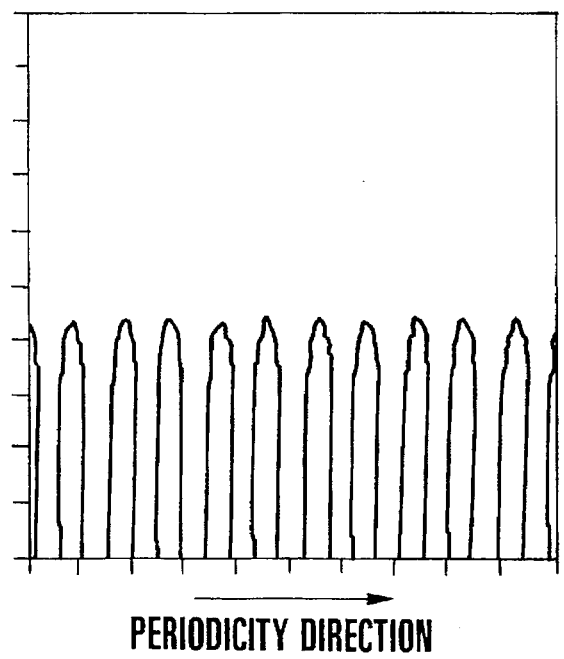
FIG. 20 is a plan view showing an optical image formed when the pupil filter in FIG. 19 is used.

FIG. 20 shows the state of an optical image formed when this pupil filter is used. As is apparent from FIG. 20, the pattern end portions are completely isolated, unlike the state shown in FIG. 12.

This pupil filter is effective for a periodic pattern having periodicity in the $x$ direction in FIG. 19. However, with respect to a periodic pattern having periodicity in the $y$ direction, since the pupil filter blocks ±1st-order diffracted light beams from the inner portions of the pattern, no pattern is formed on the image projection plane.

Figure 21:
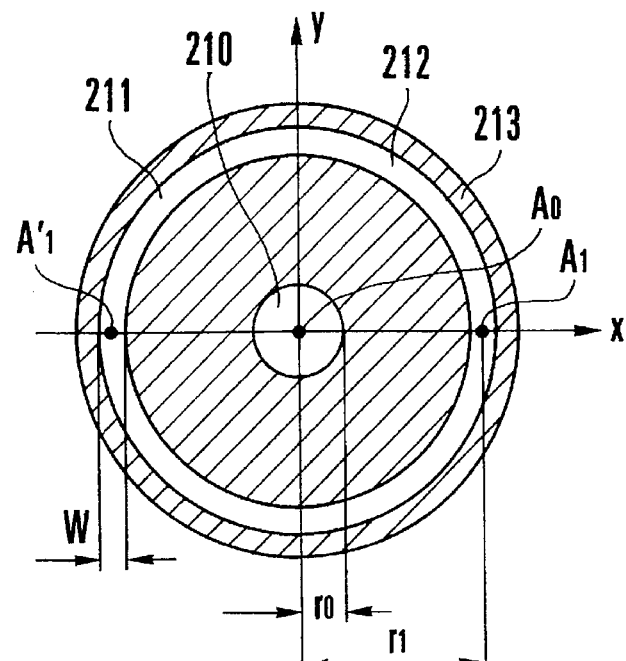
FIG. 21 is a plan view showing the arrangement of a pupil filter for regulating diffracted light in the stripe direction of a lines and spaces pattern formed in still another embodiment of the present invention.

The pupil filter shown in FIG. 21, however, is effective for periodic patterns having periodicity in any directions.

FIG. 21 shows the arrangement of the pupil filter having no direction dependence.

Referring to FIG. 21, reference numeral 210 denotes a central light-transmitting portion; 211, an annular light-transmitting portion; 212, a main light-shielding portion; and 213, a peripheral light-shielding portion. Similar to FIG. 13A, reference symbols $A_0$, $A_1$, and $A_1'$ respectively denote a 0th-order diffracted light beam, a +1st-order diffracted light beam, and a −1st-order diffracted light beam.

A radius r0 of the central light-transmitting portion 210 and a width w of the annular light-transmitting portion 211 are set such that the difference between the z component of the wave number of a diffracted light beam from a target periodic pattern end portion in the stripe direction and that of a diffracted light beam from an inner portion of the periodic pattern is suppressed to 10% or less. That is, the radius r0 is 30% or less of the radius of the pupil plane of the projection lens, and the width w is $r0^2/r1$ or less where r1 is the distance from the passage point of the light beam $A_0$ and the passage point of the light beam $A_1'$. That is, if the period of the periodic pattern on the mask is represented by pλ/NA, and the radius of the pupil plane is represented by 1, then r1=1/p.

Figure 22:
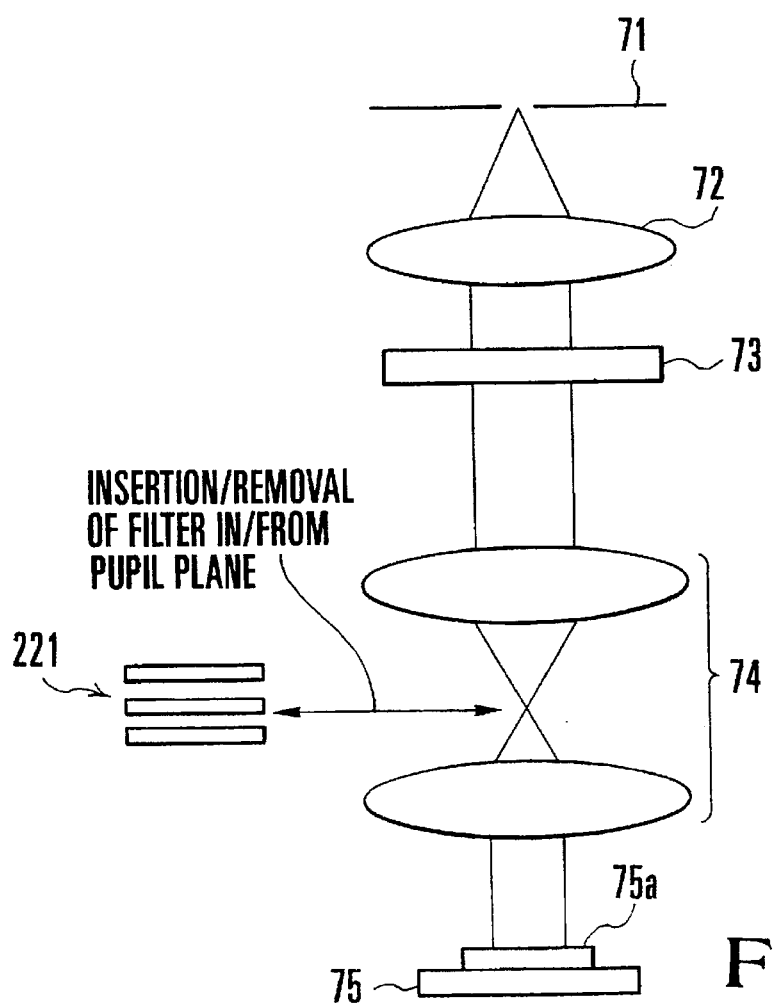
FIG. 22 is a view showing the arrangement of a projection exposure apparatus using a pupil filter according to still another embodiment of the present invention.
Figure 23:
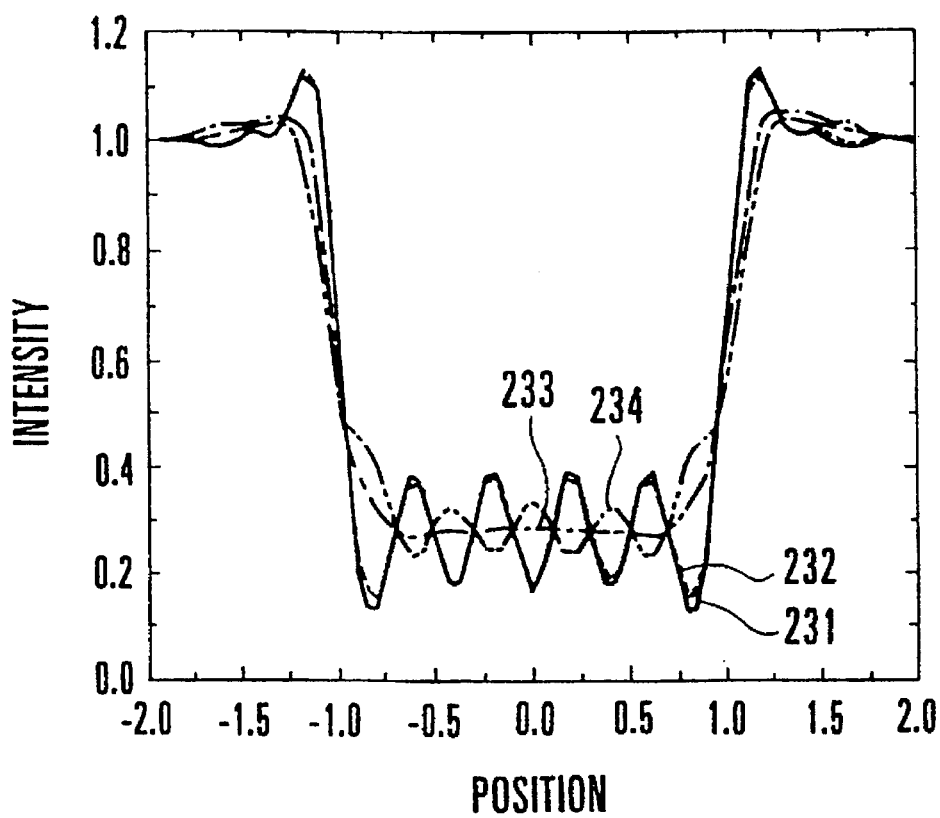
FIG. 23 is a graph showing the intensity distributions of a lines and spaces pattern having a pitch of 0.4 λ (exposure wavelength)/NA (numerical aperture), on an image projection plane, in a normal projection exposure operation.
Figure 24:
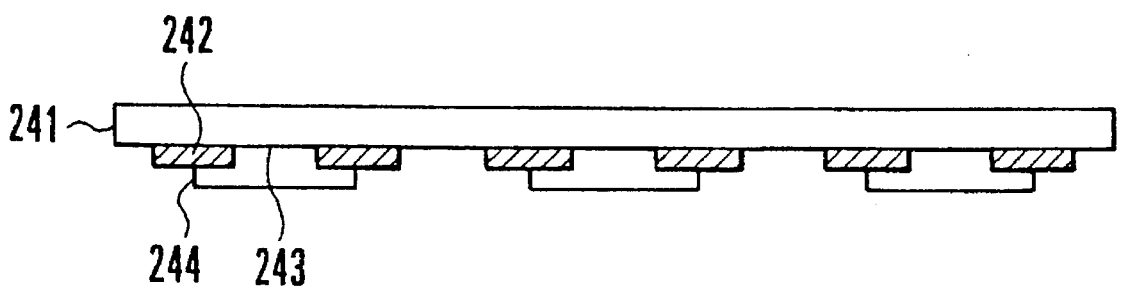
FIG. 24 is a sectional view showing the arrangement of a phase-shifting mask.
Figure 25:
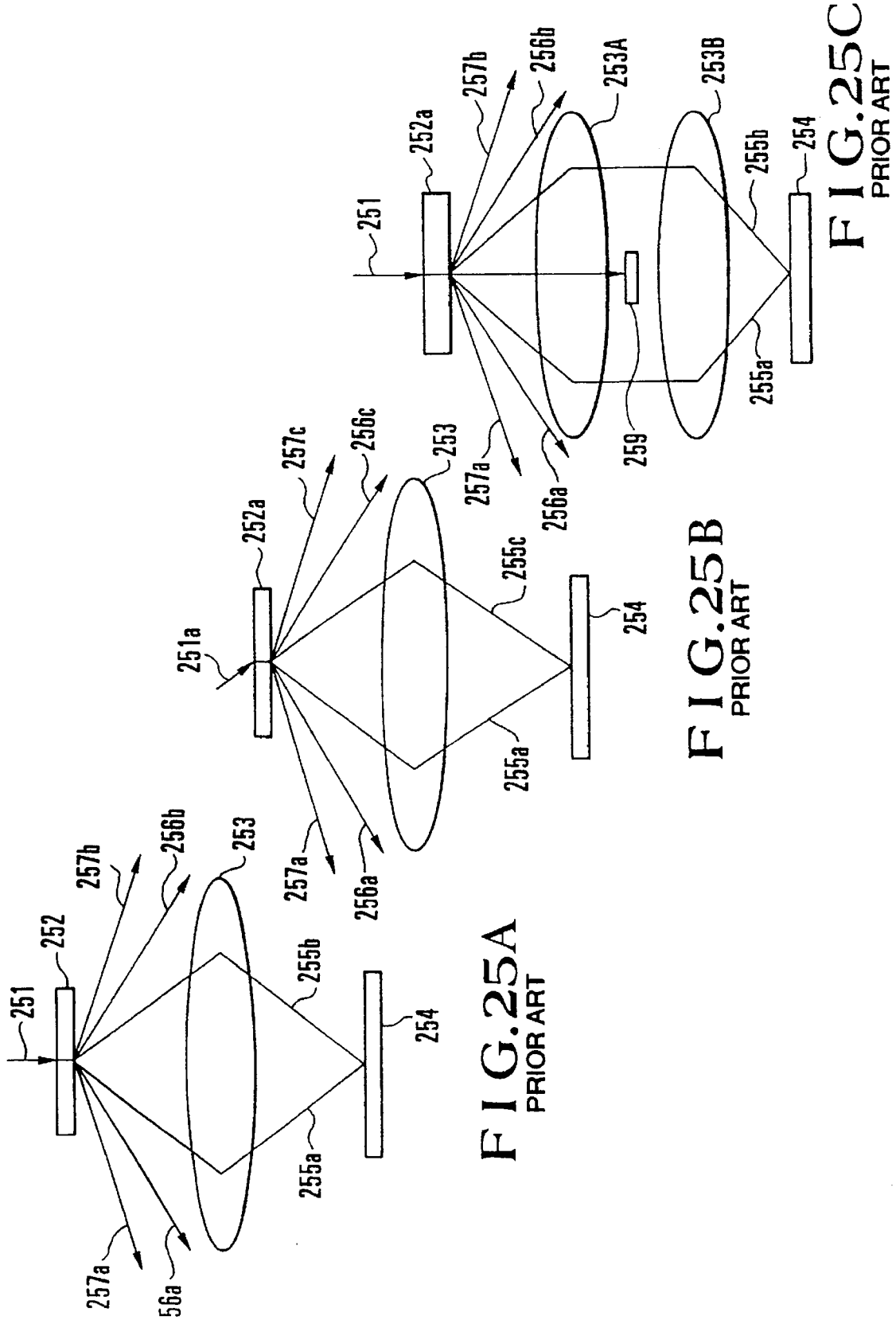
FIGS. 25A, 25B, and 25C are sectional views each showing a conventional arrangement for projection exposure.
Figure 26:
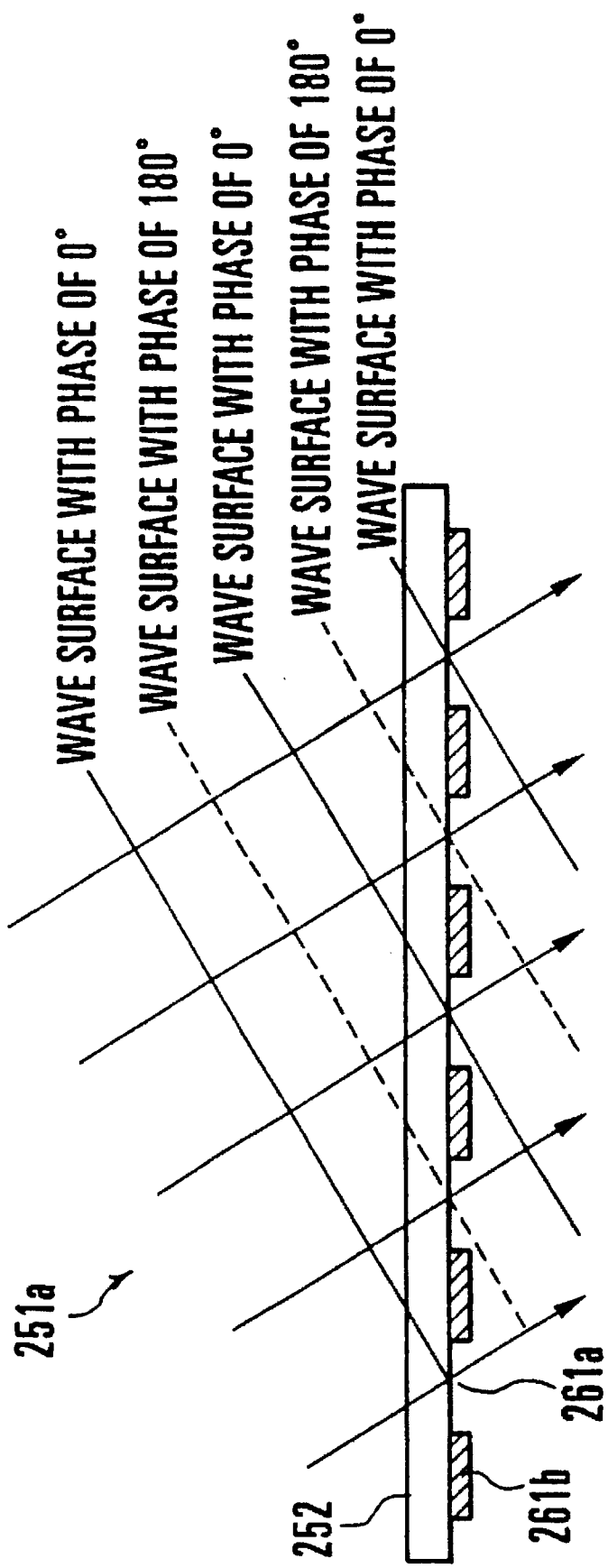
FIG. 26 is a sectional view for explaining a projection exposure operation using conventional modified illumination.
Figure 27:
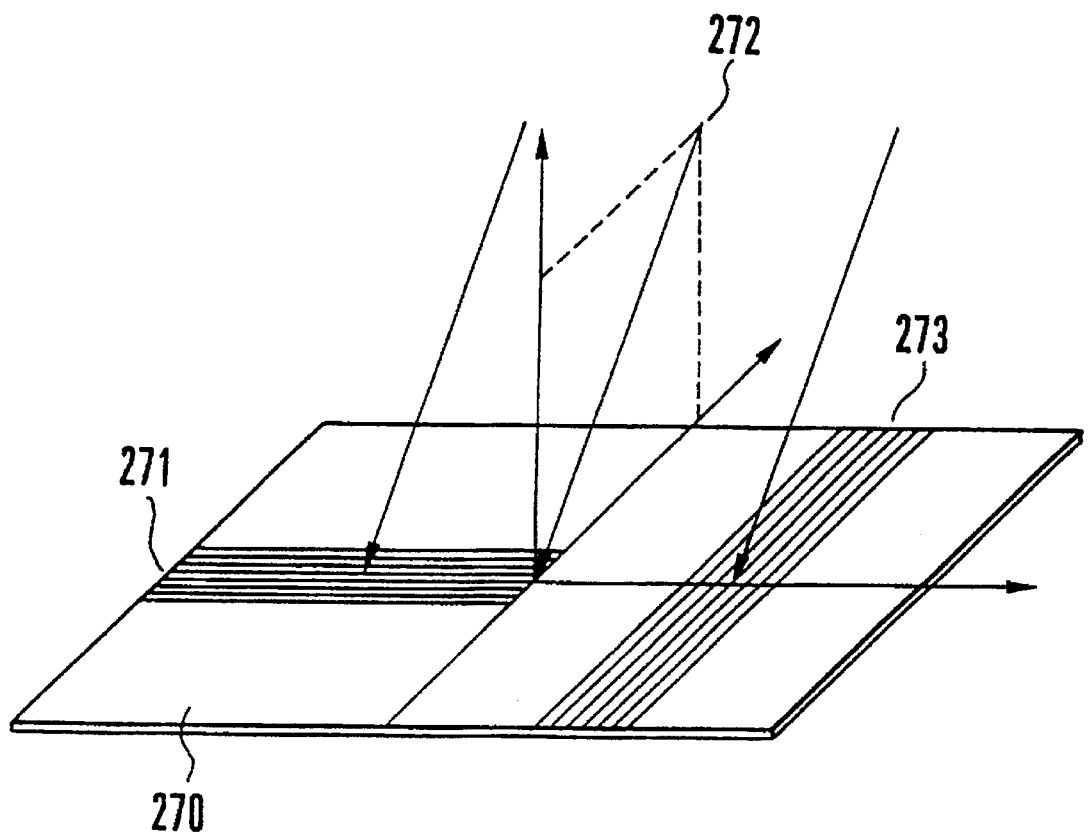
FIG. 27 is a perspective view for explaining a projection exposure operation using modified illumination.

The above pupil filter may be detachably mounted on the pupil plane in a reduction projection system 74, as shown in FIG. 22.

Similar to FIG. 7, FIG. 22 shows the arrangement of a projection exposure apparatus capable of performing exposure while changing the relative positions of a wafer 75a and a photomask 73 in the optical axis direction. Referring to FIG. 22, reference numeral 221 denotes pupil filters. Other reference numerals in FIG. 22 denote the same parts as in FIG. 7.

A plurality of pupil filters 221 corresponding to the patterns of photomasks 73 to be used are prepared, and the filters are inserted/removed in/from the pupil plane of the reduction projection system 74 by a pupil filter mounting means.

By using this projection exposure apparatus, a lines and spaces pattern on a photomask can be created with the end portions being isolated from each other. Note that the pupil filter in the 14th embodiment is not designed to block a direct beam having a high intensity and passing through the projection lens.

For this reason, the temperature of the pupil filter is not increased unnecessarily high by blocked light, and hence this increase in temperature has no adverse effect on projection exposure.

The above embodiments have been described with reference to lines and spaces patterns. However, periodic patterns to which the present invention can be applied are not limited to lines and spaces patterns.

For example, as a periodic pattern, a pattern having dot or hole patterns arranged vertically and horizontally at the same pitch is available. Such a pattern can be used as a two-dimensional diffraction grating. If a value obtained by multiplying the pitches of a mask pattern in the x direction and the y direction perpendicular thereto by a magnification is represented by L, a two-dimensional diffraction grating having a pitch of 0.5L can be formed with a practical depth of focus by the above exposure method of the embodiments, which uses the value of Δ given by equation (4). In addition, for example, a circular pattern consisting of concentric circles each having a radius different from that of an adjacent circle by a predetermined value is available as a periodic pattern. If a value obtained by multiplying the pitch of the mask pattern in the radial direction by a magnification is represented by L, a two-dimensional diffraction grating having a pitch of 0.5L can be formed with a practical depth of focus by the above exposure method of the embodiments, which uses the value of Δ given by equation (4).

As has been described above, according to the present invention, exposure is performed two times at two points separated from each other by Δ in the optical axis direction.

In addition, in the present invention, after the first exposure operation is performed at a predetermined position, the second exposure operation is performed at a position shifted from the predetermined position by a distance corresponding to ½ the period L of the periodic pattern, formed on the photomask, on the image projection plane in the periodicity direction of the pattern.

With this operation, according to the present invention, a photomask on which a periodic mask pattern having a period L, on the image projection plane, which is equal to or smaller than a value obtained by doubling an exposure wavelength λ of an illumination light source and dividing the resultant value by a numerical aperture NA of the projection system is used to form a periodic pattern having a period ½ the period L on the wafer.

In addition, according to the present invention, since the average transmittance obtained by averaging the transmittances of a periodic mask pattern in the periodicity direction is gradually increased toward each end portion in a direction perpendicular to the periodicity direction of the periodic mask pattern, diffracted light is not easily generated from each end portion of the periodic mask pattern.

In the present invention, of the diffracted light beams from a periodic mask pattern, the wave numbers of diffracted light beams propagating in a direction perpendicular to the periodicity direction of the periodic mask pattern are regulated on the pupil plane of the projection system. For this reason, diffracted light from each end portion of the periodic mask pattern does not easily reach the image plane.

The present invention, therefore, can eliminate the following phenomenon: the end portions of a periodic pattern formed on a wafer are connected to each other because of diffracted light beams generated by the end portions of the periodic mask pattern in a direction perpendicular to the periodicity direction.

The present invention is not limited to the above embodiments, and various modifications thereof can be made. For example, in some embodiments including the first embodiment, control is performed in such a manner that the position of the image projection plane on the wafer and the position of the image plane of the projection system are separated by a predetermined distance in the main exposure operation, and the respective positions in the main exposure operation are shifted by the amount Δ on the optical axis in the sub-exposure operation. In addition, according to the above embodiments, the second exposure operation is performed at a position shifted in the periodicity direction by a distance ½ the period L on the image projection plane of the period pattern. As is apparent, with a combination of the above techniques, the positions of the respective planes in the main and sub-exposure operations need not be set on the optical axis of the wafer, but can be shifted in the optical axis direction or the periodicity direction.

What is claimed is:

1. A projection exposure method of irradiating illumination light from an illumination light source onto a photomask made of a transparent substrate having a periodic mask pattern formed thereon, and projecting the resultant transmitted light from said photomask on a wafer through a projection system, thereby forming an optical image of the periodic mask pattern on the wafer, wherein projection and exposure with respect to the wafer are performed by a main exposure operation and a sub-exposure operation to be performed after the main exposure operation, the main exposure operation is performed by irradiating said photomask with the illumination light whose coherency becomes not more than 0.3 when a period L of the periodic mask pattern on an image plane of said projection system is not more than a value obtained by doubling an exposure wavelength λ of said illumination light source, and dividing the resultant value by a numerical aperture of said projection system, and the sub-exposure operation is performed by irradiating said photomask with the illumination light whose coherency is not more than 0.3 at at least one of a plurality of positions separated from a position in the main exposure operation in an optical axis direction by $\Delta=\lambda/[2\{1-(1-\lambda^2/L^2)^{1/2}\}]$, thereby forming a periodic pattern having a period ½ the period L on the wafer.

2. A method according to claim 1, wherein the sub-exposure operation is performed by continuously irradiating said photomask with the illumination light up to a position separated from the position in the main exposure operation by an integer multiple of $\Delta=\lambda/[2\{1-(1-\lambda^2/L^2)^{1/2}\}]$ in the optical axis direction.

3. A method according to claim 1, wherein the periodic mask pattern of said photomask is designed such that each light-transmitting portion is narrower than each light-shielding portion.

4. A method according to claim 3, wherein a portion corresponding to the light-shielding portion of said photomask is a halftone phase-shifting mask for transmitting light with a predetermined transmittance and a predetermined phase.

5. A method according to claim 1, wherein a dose for the sub-exposure operation is controlled in accordance with a change in the transmittance of said photoresist for forming the periodic pattern on the wafer upon irradiation of light.

6. A method according to claim 1, wherein an average transmittance of said photomask, which is obtained by averaging transmittances of the periodic mask pattern in a periodicity direction thereof, increases toward an end portion of the mask pattern in a direction perpendicular to the periodicity direction.

7. A method according to claim 1, wherein a wave number of a diffracted light beam, of diffracted light beams from the periodic mask pattern, which propagates in a direction perpendicular to the periodicity direction of the periodic mask pattern is regulated on a pupil plane of said projection system.

8. A projection exposure apparatus for irradiating illumination light from an illumination light source onto a photomask made of a transparent substrate having a periodic mask pattern formed thereon, and projecting/exposing the resultant transmitted light from said photomask onto a wafer through a projection system, thereby forming an optical image of the periodic mask pattern on the wafer, comprising:

an illumination light source having a coherency of not more than 0.3; and optical control means for calculating a value $\Delta=\lambda/[2\{1-(1-\lambda^2/L^2)^{1/2}\}]$ from a period L of the periodic mask pattern on the image plane and a wavelength λ of said illumination light source, and performing control to set an image projection plane on the wafer and the image plane of said projection system at positions separated from each other by a predetermined distance so as to set a first positional relationship in a main exposure operation, and to make the respective planes have a positional relationship different from the first positional relationship in the main exposure operation by the value Δ on an optical axis in a sub-exposure operation, wherein exposure is performed while the image projection plane on the wafer and the image plane of said projection system have a plurality of positional relationships with respect to the first positional relationship.

9. An apparatus according to claim 8, wherein said optical control means controls the positional relationship in the sub-exposure operation to change the positional relationship from the positional relationship in the main exposure operation in units of values Δ.

10. An apparatus according to claim 9, further comprising continuous exposure means for continuously irradiating light from said illumination light source while said optical control means changes relative positions of the image projection plane on the wafer and the image plane of said projection system from the positional relationship in the main exposure operation to the positional relationship in the sub-exposure operation.

11. An apparatus according to claim 9, wherein said optical control means performs control to set a plurality of positional relationships which change in units of values Δ by moving the wafer in the optical axis direction.

12. An apparatus according to claim 9, wherein said optical control means performs control to set a plurality of positional relationships which change in units of values Δ by moving said photomask in the optical axis direction.

13. An apparatus according to claim 9, wherein said optical control means performs control to set a plurality of positional relationships which change in units of values Δ by moving said projection system in the optical axis direction.

14. An apparatus according to claim 9, further comprising a plane-parallel plate insertion mechanism for inserting/removing a plane-parallel plate made of a transparent member having a refractive index different from that of an atmosphere in/from a space between said photomask and the wafer such that said plane-parallel plate is perpendicular to an optical axis of said projection system, so that said optical control means controls said plane-parallel plate insertion mechanism to insert said plane-parallel plate in an optical path located after said photomask, thereby performing control to set a plurality of positional relationships which change in units of values Δ.

15. A projection exposure method of irradiating illumination light from an illumination light source onto a photomask made of a transparent substrate having a periodic mask pattern formed thereon, and projecting the resultant transmitted light from said photomask on a wafer through a projection system, thereby forming an optical image of the periodic mask pattern on the wafer, wherein when a period L of the period mask pattern on an image plane of said projection system is not more than a value obtained by doubling an exposure wavelength λ of said illumination light source and dividing the resultant value by a numerical aperture of said projection system, exposure is performed by continuously irradiating the illumination light having a coherency of not more than 0.3 on said photomask until the wafer at a predetermined first position is moved to a second position in an optical axis direction by an integer multiple of $\Delta=\lambda/[2\{1-(1-\lambda^2/L^2)^{1/2}\}]$, thereby forming a periodic pattern having a period ½ the period L on the wafer.

16. A projection exposure method of irradiating illumination light from an illumination light source onto a photomask made of a transparent substrate having a periodic mask pattern formed thereon, and projecting the resultant transmitted light from said photomask on a wafer through a projection system, thereby forming an optical image of the periodic mask pattern on the wafer, wherein when a period L of the period mask pattern on an image plane of said projection system is not more than a value obtained by doubling an exposure wavelength $\lambda$ of said illumination light source and dividing the resultant value by a numerical aperture of said projection system, a main exposure operation is performed by irradiating illumination light having a coherency of not more than 0.3 on said photomask, and the wafer or an optical image of the periodic mask pattern is moved at least once, by ½ the period L for one movement, in a periodicity direction of said periodic mask pattern which is perpendicular to an optical axis of said illumination light source, thereby performing a sub-exposure operation at each position.

* * * * *